(12) United States Patent
Mi et al.

(10) Patent No.: US 11,227,524 B2
(45) Date of Patent: Jan. 18, 2022

(54) SHIFT REGISTER UNIT AND DRIVING METHOD THEREOF, GATE DRIVING CIRCUIT AND DRIVING METHOD THEREOF, AND DISPLAY DEVICE

(71) Applicants: BEIJING BOE OPTOELECTRONICS TECHNOLOGY CO., LTD, Beijing (CN); BOE TECHNOLOGY GROUP CO., LTD, Beijing (CN)

(72) Inventors: Lei Mi, Beijing (CN); Yanna Xue, Beijing (CN); Zhiying Bao, Beijing (CN); Yong Zhang, Beijing (CN); Lu Bai, Beijing (CN); Gang Hua, Beijing (CN); Jingpeng Wang, Beijing (CN); Haobo Fang, Beijing (CN)

(73) Assignees: BEIJING OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 485 days.

(21) Appl. No.: 16/332,567

(22) PCT Filed: Jul. 17, 2018

(86) PCT No.: PCT/CN2018/095990
§ 371 (c)(1),
(2) Date: Mar. 12, 2019

(87) PCT Pub. No.: WO2019/062287
PCT Pub. Date: Apr. 4, 2019

(65) Prior Publication Data
US 2021/0335175 A1  Oct. 28, 2021

(30) Foreign Application Priority Data
Sep. 29, 2017 (CN) .......................... 201710910078.0

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0421* (2013.01);
(Continued)

(58) Field of Classification Search
CPC ............. G09G 3/20; G09G 2300/0421; G09G 2300/08; G09G 2310/0267; G09G 2310/0286; G09G 210/08; G11C 19/28
See application file for complete search history.

(56) References Cited

U.S. PATENT DOCUMENTS 9,130,563 B1  9/2015  Jami
10,175,925 B2  1/2019  Dun
(Continued)

FOREIGN PATENT DOCUMENTS

CN  101777386 A  7/2010
CN  104252853 A  12/2014
(Continued)

OTHER PUBLICATIONS

International Search Report and Written Opinion dated Sep. 27, 2018.

*Primary Examiner* — Charles V Hicks
(74) *Attorney, Agent, or Firm* — Dilworth & Barrese, LLP.; Michael J. Musella, Esq.

(57) ABSTRACT

A shift register unit and a driving method thereof, a gate driving circuit and a driving method thereof, and a display device are provided to improve a stability of the shift register unit. The shift register unit includes a first input circuit, a second input circuit, an output circuit, a first pull-down circuit, and a second pull-down circuit and further includes: a first pull-down control circuit configured to control a level (Continued)

of the first pull-down node; a second pull-down control circuit configured to output a voltage of the third voltage terminal to the first pull-down node under the control of the fifth voltage terminal; a third pull-down control circuit configured to control a level of the second pull-down node; and a fourth pull-down control circuit configured to output the voltage of the third voltage terminal to the second pull-down node under the control of the fourth voltage terminal.

20 Claims, 6 Drawing Sheets

(52) U.S. Cl.
CPC .  *G09G 2300/08* (2013.01); *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 2015/0123826 A1 | 5/2015 | Lee et al. | |
| 2015/0243238 A1* | 8/2015 | Jung | G09G 3/3648 345/103 |

FOREIGN PATENT DOCUMENTS

| | | |
|---|---|---|
| CN | 106023874 A | 10/2016 |
| CN | 107527587 A | 12/2017 |

* cited by examiner

SHIFT REGISTER UNIT AND DRIVING METHOD THEREOF, GATE DRIVING CIRCUIT AND DRIVING METHOD THEREOF, AND DISPLAY DEVICE

The present application claims priority to Chinese Patent Application No. 201710910078.0, filed on Sep. 29, 2017, and the entire content disclosed by the Chinese Patent Application is incorporated herein by reference as part of the present application.

TECHNICAL FIELD

Embodiments of the present disclosure relate to a shift register unit and a driving method thereof, a gate driving circuit and a driving method thereof, and a display device.

BACKGROUND

In recent years, the development of displays has shown a trend of high integration and low costs, and the implementation of mass production of GOA (Gate Driver on Array) technologies is of great importance. By using the GOA technologies to integrate a gate driving circuit on an array substrate of a display panel, a gate driving integrated circuit portion may be omitted, thereby reducing product costs in terms of material costs and manufacturing processes. Such a gate switching circuit integrated on an array substrate by GOA technologies is also referred to as a GOA circuit or a shift register circuit, and each of the shift registers in the gate switching circuit is also referred to as a GOA unit.

SUMMARY

At least one embodiment of the present disclosure provides a shift register unit, which comprises a first input circuit, a second input circuit, an output circuit, a first pull-down control circuit, a second pull-down control circuit, a third pull-down control circuit, a fourth pull-down control circuit, a first pull-down circuit and a second pull-down circuit;

wherein the first input circuit is connected to a first signal terminal, a first voltage terminal and a pull-up node, and configured to output a voltage of the first voltage terminal to the pull-up node under a control of the first signal terminal;

the second input circuit is connected to a second signal terminal, a second voltage terminal and a pull-up node, and configured to output a voltage of the second voltage terminal to the pull-up node under a control of the second signal terminal;

the output circuit is connected to a clock signal terminal, the pull-up node and the signal output terminal, and configured to output a clock signal of the clock signal terminal to the signal output terminal under a control of the pull-up node;

the first pull-down control circuit is connected to the pull-up node, a third voltage terminal, a fourth voltage terminal and a first pull-down node, and configured to control a level of the first pull-down node;

the second pull-down control circuit is connected to a fifth voltage terminal, the third voltage terminal and the first pull-down node, and configured to output a voltage of the third voltage terminal to the first pull-down node under a control of the fifth voltage terminal;

the first pull-down circuit is connected to the first pull-down node, the third voltage terminal and the signal output terminal, and configured to output a voltage of the third voltage terminal to the signal output terminal under a control of the first pull-down node;

the third pull-down control circuit is connected to the pull-up node, the third voltage terminal, the fifth voltage terminal and a second pull-down node, and configured to control a level of the second pull-down node;

the fourth pull-down control circuit is connected to the fourth voltage terminal, the third voltage terminal and the second pull-down node, and configured to output a voltage of the third voltage terminal to the second pull-down node under a control of the fourth voltage terminal; and the second pull-down circuit is connected to the second pull-down node, the third voltage terminal and the signal output terminal, and configured to output a voltage of the third voltage terminal to the signal output terminal under a control of the second pull-down node.

For example, the shift register unit provided by an embodiment of the present disclosure further comprises a first noise reduction circuit and a second noise reduction circuit; and/or a reset circuit;

wherein the first noise reduction circuit is connected to the first pull-down node, the third voltage terminal and the pull-up node, and configured to output a voltage of the third voltage terminal to the pull-up node under a control of the first pull-down node;

the second noise reduction circuit is connected to the second pull-down node, the third voltage terminal and the pull-up node, and configured to output a voltage of the third voltage terminal to the pull-up node under a control of the second pull-down node; and the reset circuit is connected to a third signal terminal, the third voltage terminal, the pull-up node and the signal output terminal, and configured to output a voltage of the third voltage terminal to the pull-up node and the signal output terminal under a control of the third signal terminal.

For example, in the shift register unit provided by at least one embodiment of the present disclosure, the second input circuit comprises a first transistor;

a gate electrode of the first transistor is connected to the second signal terminal, a first electrode of the first transistor is connected to the second voltage terminal, a second electrode of the first transistor is connected to the pull-up node.

For example, in the shift register unit provided by at least one embodiment of the present disclosure, the first input circuit comprises a second transistor;

a gate electrode of the second transistor is connected to the first signal terminal, a first electrode of the second transistor is connected to the first voltage terminal, a second electrode of the second transistor is connected to the pull-up node.

For example, in the shift register unit provided by at least one embodiment of the present disclosure, the output circuit comprises a third transistor and a capacitor;

a gate electrode of the third transistor is connected to the pull-up node, a first electrode of the third transistor is connected to the clock signal terminal, a second electrode of the third transistor is connected to the signal output terminal and a second terminal of the capacitor; and a first terminal of the capacitor is connected to the pull-up node, the second terminal of the capacitor is connected to the signal output terminal.

For example, in the shift register unit provided by at least one embodiment of the present disclosure, the first pull-down control circuit comprises a fourth transistor and a fifth transistor;

a gate electrode of the fourth transistor is configured to receive a voltage of the fourth voltage terminal, a first electrode of the fourth transistor is connected to the fourth voltage terminal, a second electrode of the fourth transistor is connected to the first pull-down node; and a gate electrode of the fifth transistor is connected to the pull-up node, a first electrode of the fifth transistor is connected to the third voltage terminal, a second electrode of the fifth transistor is connected to the first pull-down node.

For example, in the shift register unit provided by at least one embodiment of the present disclosure, the first pull-down control circuit further comprises a sixth transistor and a seventh transistor;

a gate electrode of the sixth transistor is connected to the fourth voltage terminal, a first electrode of the sixth transistor is connected to the fourth voltage terminal, a second electrode of the sixth transistor is connected to the gate electrode of the fourth transistor; and a gate electrode of the seventh transistor is connected to the pull-up node, a first electrode of the seventh transistor is connected to the third voltage terminal, a second electrode of the seventh transistor is connected to the gate electrode of the fourth transistor.

For example, in the shift register unit provided by at least one embodiment of the present disclosure, the second pull-down circuit comprises an eighth transistor; and a gate electrode of the eighth transistor is connected to the fifth voltage terminal, a first electrode of the eighth transistor is connected to the third voltage terminal, a second electrode of the eighth transistor is connected to the first pull-down node.

For example, in the shift register unit provided by at least one embodiment of the present disclosure, the third pull-down control circuit comprises a ninth transistor and a tenth transistor;

a gate electrode of the ninth transistor is configured to receive a voltage of the fifth voltage terminal, a first electrode of the ninth transistor is connected to the fifth voltage terminal, a second electrode of the ninth transistor is connected to the second pull-down node; and a gate electrode of the tenth transistor is connected to the pull-up node, a first electrode of the tenth transistor is connected to the third voltage terminal, a second electrode of the tenth transistor is connected to the second pull-down node.

For example, in the shift register unit provided by at least one embodiment of the present disclosure, the third pull-down control circuit further comprises an eleventh transistor and a twelfth transistor;

a gate electrode of the eleventh transistor is connected to the fifth voltage terminal, a first electrode of the eleventh transistor is connected to the fifth voltage terminal, a second electrode of the eleventh transistor is connected to the gate electrode of the ninth transistor; and a gate electrode of the twelfth transistor is connected to the pull-up node, a first electrode of the twelfth transistor is connected to the third voltage terminal, a second electrode of the twelfth transistor is connected to the gate electrode of the ninth transistor.

For example, in the shift register unit provided by at least one embodiment of the present disclosure, the fourth pull-down control circuit comprises a thirteenth transistor; and a gate electrode of the thirteenth transistor is connected to the fourth voltage terminal, a first electrode of the thirteenth transistor is connected to the third voltage terminal, a second electrode of the thirteenth transistor is connected to the second pull-down node.

For example, in the shift register unit provided by at least one embodiment of the present disclosure, the first pull-down circuit comprises a fourteenth transistor;

a gate electrode of the fourteenth transistor is connected to the first pull-down node, a first electrode of the fourteenth transistor is connected to the third voltage terminal, a second electrode of the fourteenth transistor is connected to the signal output terminal.

For example, in the shift register unit provided by at least one embodiment of the present disclosure, the second pull-down circuit comprises a fifteenth transistor;

a gate electrode of the fifteenth transistor is connected to the second pull-down node, a first electrode of the fifteenth transistor is connected to the third voltage terminal, a second electrode of the fifteenth transistor is connected to the signal output terminal.

For example, in the shift register unit provided by at least one embodiment of the present disclosure, in a case where the shift register unit further comprises a first noise reduction circuit and a second noise reduction circuit, the first noise reduction circuit comprises a sixteenth transistor, the second noise reduction circuit comprises a seventeenth transistor;

a gate electrode of the sixteenth transistor is connected to the first pull-down node, a first electrode of the sixteenth transistor is connected to the third voltage terminal, a second electrode of the sixteenth transistor is connected to the pull-up node;

a gate electrode of the seventeenth transistor is connected to the second pull-down node, a first electrode of the seventeenth transistor is connected to the third voltage terminal, a second electrode of the seventeenth transistor is connected to the pull-up node;

in a case where the shift register unit further comprises a reset circuit, the reset circuit comprises an eighteenth transistor and a nineteenth transistor;

a gate electrode of the eighteenth transistor is connected to the third signal terminal, a first electrode of the eighteenth transistor is connected to the third voltage terminal, a second electrode of the eighteenth transistor is connected to the signal output terminal; and a gate electrode of the nineteenth transistor is connected to the third signal terminal, a first electrode of the nineteenth transistor is connected to the third voltage terminal, a second electrode of the nineteenth transistor is connected to the pull-up node.

At least one embodiment of the present disclosure provides a gate driving circuit, which comprises at least two stages of cascaded shift register units according to any embodiment of the present disclosure;

wherein a first signal terminal of the shift register unit of a first stage is connected to a start signal terminal;

except the shift register unit of the first stage, a signal output terminal of the shift register unit of a previous stage is connected to a first signal terminal of the shift register unit of a next stage;

except the shift register unit of a last stage, a signal output terminal of a shift register unit of a next stage is connected to a second signal terminal of the shift register unit of a previous stage; and a second signal terminal of the shift register unit of the last stage is connected to the start signal terminal or a reset signal terminal separately arranged.

At least one embodiment of the present disclosure provides a display device, comprising the gate driving circuit according to any one embodiment of the present disclosure.

At least one embodiment of the present disclosure provides a method of driving the shift register unit according to any one embodiment of the present disclosure, which comprises:

in a first phase:
under a control of the first signal terminal, outputting by the first input circuit a voltage of the first voltage terminal to the pull-up node;

in a second phase:
under a control of the pull-up node, outputting by the output circuit a clock signal of the clock signal terminal to the signal output terminal, and outputting by the signal output terminal a gate scan signal;

in a third phase:
under a control of the second signal terminal, outputting by the second input circuit a voltage of the second voltage terminal to the pull-up node to control the output circuit to be turned off;
under a control of the pull-up node and a turn-on voltage input by the fourth voltage terminal, outputting by the first pull-down control circuit the turn-on voltage input by the fourth voltage terminal to the first pull-down node;
under a control of the first pull-down node, outputting by the first pull-down circuit a voltage of the third voltage terminal to the signal output terminal; and
under a control of a turn-on voltage input by the fourth voltage terminal, outputting by the fourth pull-down control circuit a voltage of the third voltage terminal to the second pull-down node; or,
under a control of the second signal terminal, outputting by the second input circuit a voltage of the second voltage terminal to the pull-up node to control the output circuit to be turned off;
under a control of the pull-up node and a turn-on voltage input by the fifth voltage terminal, outputting by the third pull-down control circuit the turn-on voltage input by the fifth voltage terminal to the second pull-down node;
under a control of the second pull-down node, outputting by a second pull-down circuit the voltage of the third voltage terminal to the signal output terminal; and
under a control of the turn-on voltage input by the fifth voltage terminal, outputting by the second pull-down control circuit a voltage of the third voltage terminal to the first pull-down node.

For example, in the method of driving the shift register unit provided by at least one embodiment of the present, the shift register unit further comprises a reset circuit, the method further comprises:

in a fourth phase, under a control of a third signal terminal, outputting by the reset circuit a voltage of the third signal terminal to the pull-up node and the signal output terminal.

At least one embodiment of the present disclosure provides a method of driving the gate driving circuit according to any one embodiment of the present disclosure, which comprises:

in an odd-numbered image frame, inputting by the fourth voltage terminal of the shift register unit of each stage in the gate driving circuit a turn-on signal, inputting by the fifth voltage terminal a turn-off signal; and in an even-numbered image frame, inputting by the fifth voltage terminal of the shift register of each stage in the gate driving circuit being a turn-on signal, inputting by the fourth voltage terminal a turn-off signal

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1A:
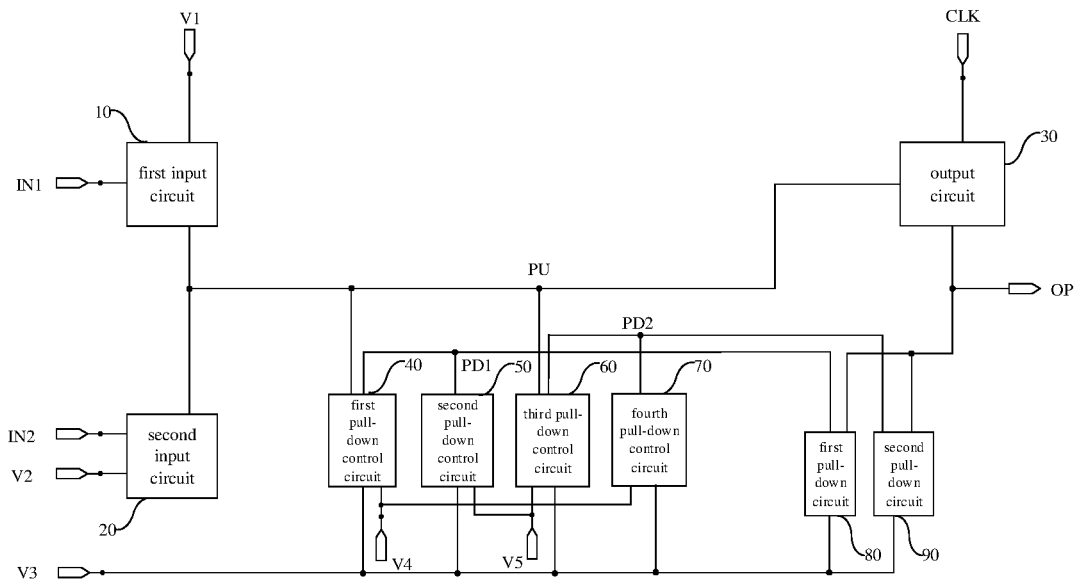
FIG. 1A is a schematic structural diagram of a shift register unit according to an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is apparent that the described embodiments are just a part but not all of the embodiments of the disclosure. Based on the described embodiments herein, those skilled in the art may obtain other embodiment, without any creative work, which shall be within the scope of the disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and in a case where the position of the object which is described is changed, the relative position relationship may be changed accordingly.

A pull-up control structure and a pull-down control structure in a shift register generally adopt thin film transistors (TFTs), and the stability of the TFTs decreases as the usage time increases. In a shift register unit, the stability of the entire circuit is improved by using two groups of pull-down control circuits which operate alternately, that is, in a case where a first pull-down node operates, a second pull-down node does not operate, and vice versa. Taking an operation of the first pull-down node as an example, in a case where the first pull-down node operates, a potential of the second pull-down node is 0V. In this mode of operation, due to the potential of the second pull-down node, the transistors in the shift register leak, thereby a potential of the pull-up node is dropped, and the stability of the shift register unit is reduced.

At least one embodiment of the present disclosure provides a shift register unit and a driving method thereof, a gate driving circuit and a driving method thereof, and a display device. In the shift register unit, a potential of a first pull-down node is commonly controlled by a first pull-down control circuit and a second pull-down control circuit, in a case where the first pull-down control circuit does not operates, the second pull-down control circuit inputs a low level of a third voltage terminal to the first pull-down node; a potential of a second pull-down node is commonly controlled by a third pull-down control circuit and a fourth pull-down control circuit, in a case where the third pull-down control circuit does not operate, the fourth pull-down control circuit inputs a low level of the third voltage terminal to the second pull-down node, in this way, in a case where the first pull-down node does not operate, the potential of the first pull-down node may be kept at a low potential rather than turning into a stable state of 0V; similarly, in a case where the second pull-down node does not operate, the potential of the second pull-down node may be kept at a low potential rather than turning into a stable state of 0V, thereby avoiding a problem that the potential of the pull-up node is lowered due to a leakage of the TFT in the shift register unit.

At least one embodiment of the present disclosure provides a shift register unit. As shown in FIG. 1A, the shift register unit includes a first input circuit 10, a second input circuit 20, an output circuit 30, a first pull-down control circuit 40, a second pull-down control circuit 50, a third pull-down control circuit 60, a fourth pull-down control circuit 70, a first pull-down circuit 80, and a second pull-down circuit 90.

For example, the first input circuit 10 is connected to a first signal terminal IN1, a first voltage terminal V1 and a pull-up node PU, and is configured for outputting a voltage of the first voltage terminal V1 to the pull-up node PU under a control of the first signal terminal IN1.

The second input circuit 20 is connected to a second signal terminal IN2, a second voltage terminal V2 and the pull-up node PU, and is configured for outputting a voltage of the second voltage terminal V2 to the pull-up node PU under a control of the second signal terminal IN2.

The output circuit 30 is connected to a clock signal terminal CLK, the pull-up node PU and a signal output terminal OP, and is configured for outputting a clock signal of the clock signal terminal CLK to the signal output terminal OP under a control of the pull-up node PU.

The first pull-down control circuit 40 is connected to the pull-up node PU, a third voltage terminal V3, a fourth voltage terminal V4 and a first pull-down node PD1, and is configured for outputting a voltage of the third voltage terminal V3 to the first pull-down node PD1 under a control of the pull-up node PU, or outputting a voltage of the fourth voltage terminal V4 to the first pull-down node PD1 under a control of the pull-up node PU.

The second pull-down control circuit 50 is connected to a fifth voltage terminal V5, the third voltage terminal V3 and the first pull-down node PD1, and is configured for outputting a voltage of the third voltage terminal V3 to the first pull-down node PD1 under a control of the fifth voltage terminal V5.

The first pull-down circuit 80 is connected to the first pull-down node PD1, the third voltage terminal V3 and a signal output terminal OP, and is configured for outputting a voltage of the third voltage terminal V3 to the signal output terminal OP under a control of the first pull-down node PD1.

The third pull-down control circuit 60 is connected to the pull-up node PU, the third voltage terminal V3, a fifth voltage terminal V5 and a second pull-down node PD2, and is configured for outputting a voltage of the third voltage terminal V3 to the second pull-down node PD2 under a control of the pull-up node PU, or outputting a voltage of the fifth voltage terminal V5 to the second pull-down node PD2 under a control of the pull-up node PU.

The fourth pull-down control circuit 70 is connected to the fourth voltage terminal V4, the third voltage terminal V3 and the second pull-down node PD2, and is configured for outputting a voltage of the third voltage terminal V3 to the second pull-down node PD2 under a control of the fourth voltage terminal V4.

The second pull-down circuit 90 is connected to the second pull-down node PD2, the third voltage terminal V3 and the signal output terminal OP, and is configured for outputting a voltage of the third voltage terminal V3 to the signal output terminal OP under a control of the second pull-down node PD2.

Figure 1B:
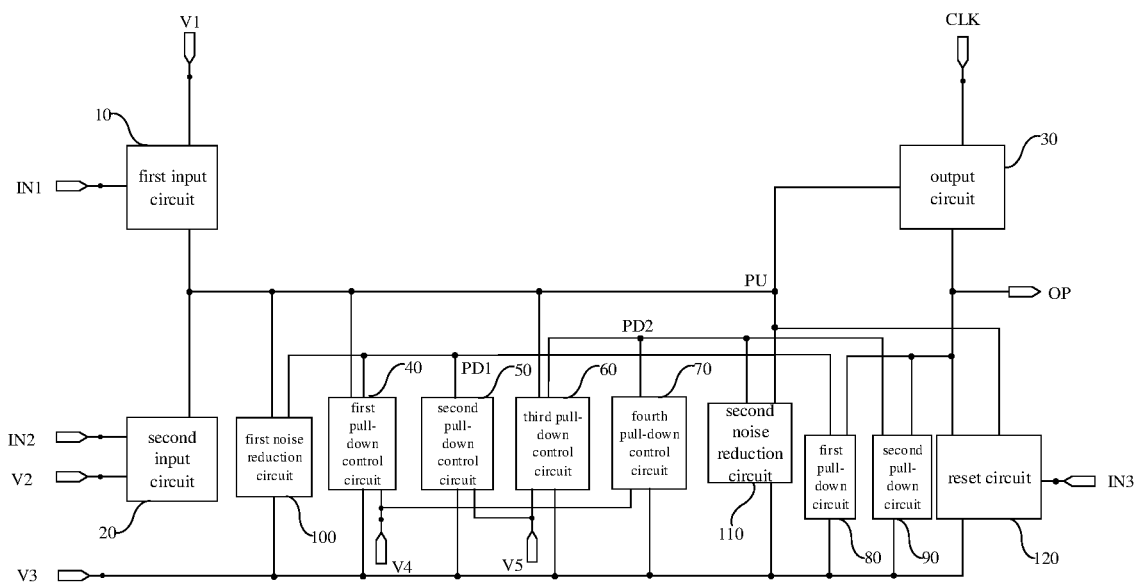
FIG. 1B is a schematic structural diagram of another shift register unit according to an embodiment of the present disclosure.

For example, as shown in FIG. 1B, the shift register unit further includes a first noise reduction circuit 100 and a second noise reduction circuit 110.

The first noise reduction circuit 100 is connected to the first pull-down node PD1, the third voltage terminal V3 and the pull-up node PU, and is configured for outputting a voltage of the third voltage terminal V3 to the pull-up node PU under a control of the first pull-down node PD1.

The second noise reduction circuit 110 is connected to the second pull-down node PD2, the third voltage terminal V3 and the pull-up node PU, and is configured for outputting a voltage of the third voltage terminal V3 to the pull-up node PU under a control of the second pull-down node PD2.

For example, as shown in FIG. 1B, the shift register unit further includes a reset circuit 120.

The reset circuit 120 is connected to a third signal terminal IN3, the third voltage terminal V3, the pull-up node PU, and the signal output terminal OP, and is configured for outputting a voltage of the third voltage terminal V3 to the pull-up node PU and the signal output terminal OP under a control of the third signal terminal IN3.

It should be noted that, in the embodiments of the present disclosure, the signals output by the above-mentioned first signal terminal IN1 and the above-mentioned second signal terminal IN2 are of opposite phases, for example, the second signal terminal IN2 outputs a low level in a case where the first signal terminal IN1 outputs a high level, or the second signal terminal IN2 outputs a high level in a case where the first signal terminal IN1 outputs a low level. In addition, in the following embodiments, the first voltage terminal V1 inputs a constant high level, and the second voltage terminal V2 and the third voltage terminal V3 input a constant low level or are grounded.

In this way, on one hand, the first input circuit 10 may output a voltage of the first voltage terminal V1 to the pull-up node PU under a control of the first signal terminal IN1, in addition, the second input circuit 20 may output a voltage of the second voltage terminal V2 to the pull-up node PU under a control of the second signal terminal IN2. In this case, in a case where the shift register unit adopts a forward scan, the voltage of the first voltage terminal V1 is used to charge the pull-up node PU, and the voltage of the second voltage terminal V2 is used to reset the pull-up node PU; in a case where the shift register unit adopts a reverse scan, the voltage of the second voltage terminal V2 is used to charge the pull-up node PU, and the voltage of the first voltage terminal V1 is used to reset the pull-up node PU. It should be noted that, in the embodiments of the present disclosure, the directions of the forward scan and the reverse scan are relative, the scan in any direction in the bidirectional scan may be referred to as a forward scan, and the scan in another direction may be referred to as a reverse scan.

After the pull-up node PU is charged, the output circuit 30 may output a clock signal of the clock signal terminal CLK to the signal output terminal OP under a control of the pull-up node PU, so that the signal output terminal OP may output a gate scan signal to a gate line connected to the signal output terminal OP in an output phase. The second input circuit 20 outputs a voltage of the second voltage terminal V2 to the pull-up node PU under a control of the second signal terminal IN2 to control a potential of the first pull-down node PD1 by the first pull-down control circuit 40 and the second pull-down control circuit 50, such that the first pull-down circuit 80 pulls down a potential of the signal output terminal OP to a potential of the third voltage terminal V3 under a control of the first pull-down node PD1, thereby performing noise reduction on the signal output terminal OP, and the first noise reduction circuit 100 pulls down a potential of the pull-up node PU to a potential of the third voltage terminal V3 under a control of the first pull-down node PD1 to perform noise reduction on the pull-up node PU. Alternatively, a potential of the second pull-down node PD2 is controlled by the third pull-down control circuit 60 and the fourth pull-down control circuit 70, such that the second pull-down circuit 90 pulls down a potential of the signal output terminal OP to a potential of the third voltage terminal V3 under a control of the second pull-down node PD2 to perform noise reduction on the signal output terminal OP, and the second noise reduction circuit 110 pulls down the potential of the pull-up node PU to a potential of the third voltage terminal V3 under a control of the second pull-down node PD2 to perform noise reduction on the pull-up node PU.

On the other hand, the reset circuit 120 may pull down the potentials of the pull-up node PU and the signal output terminal OP to a potential of the third voltage terminal V3 under a control of the third signal terminal IN3 to perform noise reduction on the pull-up node PU and the signal output terminal OP.

The potential of the first pull-down node PD1 is commonly controlled by the first pull-down control circuit 40 and the second pull-down control circuit 50. In a case where the first pull-down control circuit 40 does not operate, the second pull-down control circuit 50 inputs a low level of the third voltage terminal V3 to the first pull-down node PD1; a potential of the second pull-down node PD2 is commonly controlled by the third pull-down control circuit 60 and the fourth pull-down control circuit 70, and in a case where the third pull-down control circuit 60 does not operate, the fourth pull-down control circuit 70 inputs a low level of the third voltage terminal V3 to the second pull-down node PD2. In this way, in a case where the first pull-down node PD1 does not operate, the potential of the first pull-down node PD1 may be maintained at a low potential rather than turning into a 0V stable state; similarly, in a case where the second pull-down node PD2 does not operate, the potential of the second pull-down node PD2 may be maintained at a low potential rather than turning into a 0V stable state, thereby avoiding a problem that the potential of the pull-up node PU is lowered due to the leakage of the TFT in the shift register unit.

Figure 2:
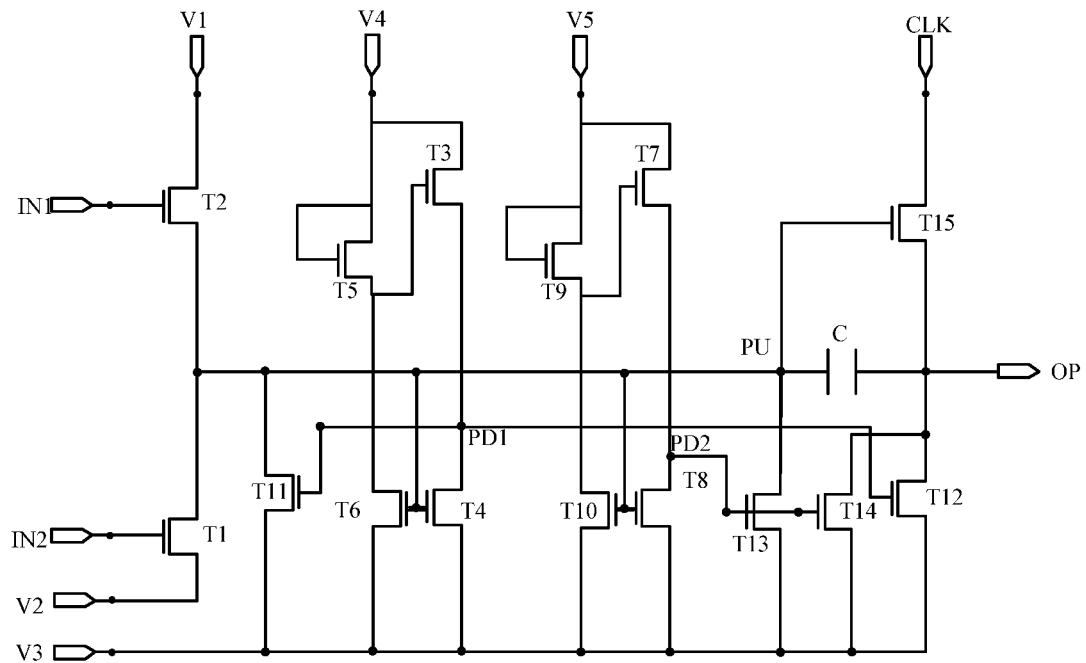
FIG. 2 is a schematic structural diagram of a shift register unit.

For example, a circuit diagram of a shift register unit is shown in FIG. 2. In this circuit, in a case where a first pull-down node PD1 does not operate, a potential of the first pull-down node PD1 is 0V; in a case where a second pull-down node PD2 does not operate, a potential of the second pull-down node PD2 is 0V. Therefore, a leakage current may occur in the TFT in the shift register unit, which may cause a potential of a pull-up node PU to decrease.

A particular structure of the shift register unit shown in FIG. 1B provided by an embodiment of the present disclosure will be described in detail below.

Figure 3A:
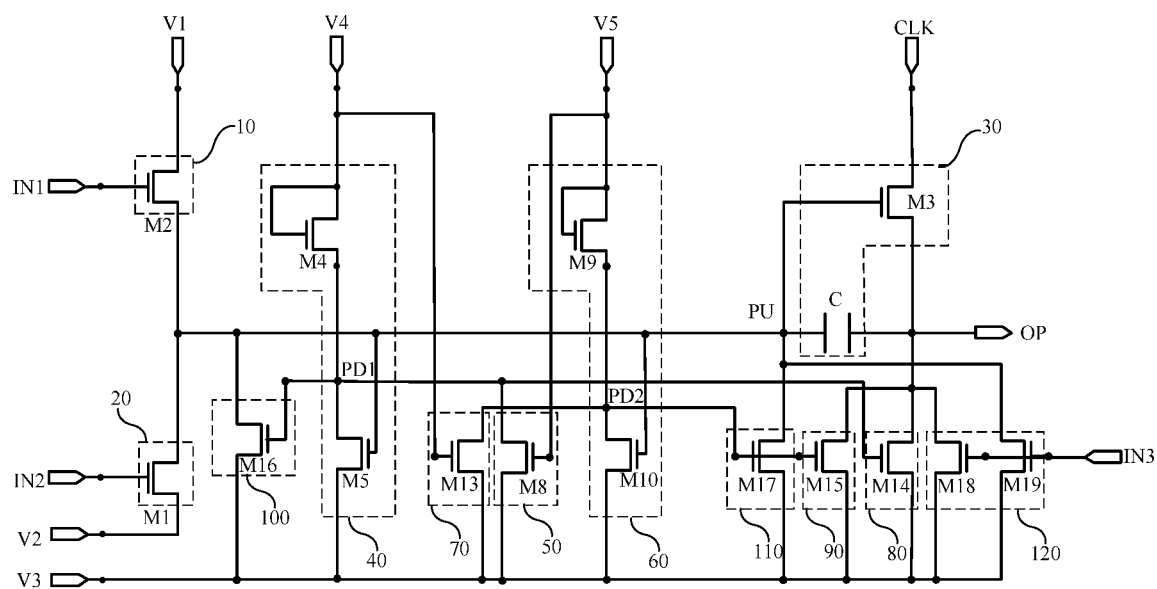
FIG. 3A is a schematic diagram of a specific structure of the shift register unit of FIG. 1B.
Figure 3B:
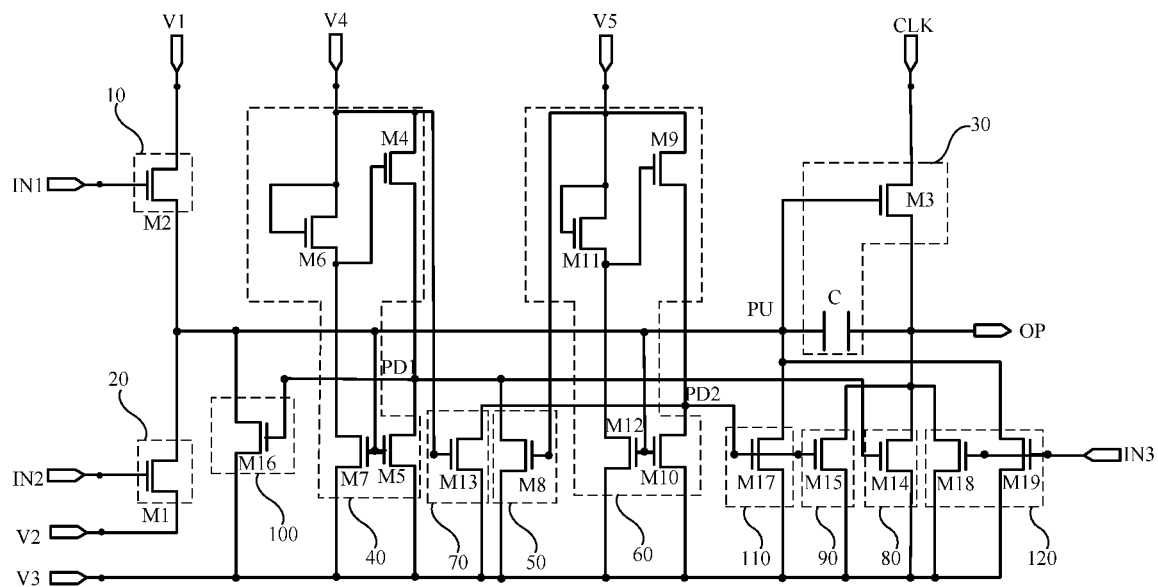
FIG. 3B is a schematic diagram of another specific structure of the shift register unit of FIG. 1B.

For example, as shown in FIG. 3A and FIG. 3B, a second input circuit 20 described above includes a first transistor M1.

A gate electrode of the first transistor M1 is connected to a second signal terminal IN2, a first electrode of the first transistor M1 is connected to a second voltage terminal V2, and a second electrode of the first transistor M1 is connected to the pull-up node PU.

A first input circuit 10 includes a second transistor M2.

A gate electrode of the second transistor M2 is connected to a first signal terminal IN1, a first electrode of the second transistor M2 is connected to a first voltage terminal V1, and a second electrode of the second transistor M2 is connected to a pull-up node PU.

As shown in FIG. 3A and FIG. 3B, an output circuit 30 includes a third transistor M3 and a capacitor C.

A gate electrode of the third transistor M3 is connected to the pull-up node PU, a first electrode of the third transistor M3 is connected to a clock signal terminal CLK, and a second electrode of the third transistor M3 is connected to a signal output terminal OP and a second terminal of the capacitor C.

A first terminal of the capacitor C is connected to the pull-up node PU, and the second terminal of the capacitor C is connected to the signal output terminal OP.

As shown in FIG. 3A, a first pull-down control circuit 40 includes a fourth transistor M4 and a fifth transistor M5.

A gate electrode of the fourth transistor M4 is connected to a fourth voltage terminal V4, a first electrode of the fourth transistor M4 is connected to the fourth voltage terminal V4, and a second electrode of the fourth transistor M4 is connected to a first pull-down node PD1.

A gate electrode of the fifth transistor M5 is connected to the pull-up node PU, a first electrode of the fifth transistor M5 is connected to the third voltage terminal V3, and a second electrode of the fifth transistor M5 is connected to the first pull-down node PD1.

As shown in FIG. 3B, the first pull-down control circuit 40 further includes a sixth transistor M6 and a seventh transistor M7.

A gate electrode of the sixth transistor M6 is connected to the fourth voltage terminal V4, a first electrode of the sixth transistor M6 is connected to the fourth voltage terminal V4, and a second electrode of the sixth transistor M6 is connected to the gate electrode of the fourth transistor M4.

A gate electrode of the seventh transistor M7 is connected to the pull-up node PU, a first electrode of the seventh transistor M7 is connected to the third voltage terminal V3, and a second electrode of the seventh transistor M7 is connected to the gate electrode of the fourth transistor M4.

As shown in FIG. 3A and FIG. 3B, the second pull-down control circuit 50 includes an eighth transistor M8.

A gate electrode of the eighth transistor M8 is connected to the fifth voltage terminal V5, a first electrode of the eighth transistor M8 is connected to the third voltage terminal V3, and a second electrode of the eighth transistor M8 is connected to the first pull-down node PD1.

As shown in FIG. 3A, the third pull-down control circuit 60 includes a ninth transistor M9 and a tenth transistor M10.

A gate electrode of the ninth transistor M9 is connected to the fifth voltage terminal V5, a first electrode of the ninth transistor M9 is connected to the fifth voltage terminal V5, and a second electrode of the ninth transistor M9 is connected to the second pull-down node PD2.

A gate electrode of the tenth transistor M10 is connected to the pull-up node PU, a first electrode of the tenth transistor M10 is connected to the third voltage terminal V3, and a second electrode of the tenth transistor M10 is connected to the second pull-down node PD2.

As shown in FIG. 3B, the third pull-down control circuit 60 further includes an eleventh transistor M11 and a twelfth transistor M12.

A gate electrode of the eleventh transistor M11 is connected to the fifth voltage terminal V5, a first electrode of the eleventh transistor M11 is connected to the fifth voltage terminal V5, and a second electrode of the eleventh transistor M11 is connected to the gate electrode of the ninth transistor M9.

A gate electrode of the twelfth transistor M12 is connected to the pull-up node PU, a first electrode of the twelfth transistor M12 is connected to the third voltage terminal V3, and a second electrode of the twelfth transistor M12 is connected to the gate electrode of the ninth transistor M9.

As shown in FIG. 3A and FIG. 3B, the fourth pull-down control circuit 70 includes a thirteenth transistor M13.

A gate electrode of the thirteenth transistor M13 is connected to the fourth voltage terminal V4, a first electrode of the thirteenth transistor M13 is connected to the third voltage terminal V3, and a second electrode of the thirteenth transistor M13 is connected to the second pull-down node PD2.

As shown in FIG. 3A and FIG. 3B, the first pull-down circuit 80 includes a fourteenth transistor M14.

A gate electrode of the fourteenth transistor M14 is connected to the first pull-down node PD1, a first electrode of the fourteenth transistor M14 is connected to the third voltage terminal V3, and a second electrode of the fourteenth transistor M14 is connected to the signal output terminal OP.

As shown in FIG. 3A and FIG. 3B, the second pull-down circuit 90 includes a fifteenth transistor M15.

A gate electrode of the fifteenth transistor M15 is connected to the second pull-down node PD2, a first electrode of the fifteenth transistor M15 is connected to the third voltage terminal V3, and a second electrode of the fifteenth transistor M15 is connected to the signal output terminal OP.

As shown in FIG. 3A and FIG. 3B, the first noise reduction circuit 100 includes a sixteenth transistor M16.

A gate electrode of the sixteenth transistor M16 is connected to the first pull-down node PD1, a first electrode of the sixteenth transistor M16 is connected to the third voltage terminal V3, and a second electrode of the sixteenth transistor M16 is connected to the pull-up node PU.

As shown in FIG. 3A and FIG. 3B, the second noise reduction circuit 110 includes a seventeenth transistor M17.

A gate electrode of the seventeenth transistor M17 is connected to the second pull-down node PD2, a first electrode of the seventeenth transistor M17 is connected to the third voltage terminal V3, and a second electrode of the seventeenth transistor M17 is connected to the pull-up node PU.

As shown in FIG. 3A and FIG. 3B, the reset circuit 120 includes an eighteenth transistor M18 and a nineteenth transistor M19.

A gate electrode of the eighteenth transistor M18 is connected to the third signal terminal IN3, a first electrode of the eighteenth transistor M18 is connected to the third voltage terminal V3, and a second electrode of the eighteenth transistor M18 is connected to the signal output terminal OP.

A gate electrode of the nineteenth transistor M19 is connected to the third signal terminal IN3, a first electrode of the nineteenth transistor M19 is connected to the third voltage terminal V3, and a second electrode of the nineteenth transistor M19 is connected to the pull-up node PU.

It should be noted that in the description of various embodiments of the present disclosure, the pull-up node PU, the first pull-down node PD1 and the second pull-down node PD2 do not represent subsistent components, but represent junctions of associated electric connections in the circuit diagram.

It should be noted that each of the transistors used in the embodiments of the present disclosure may be a thin film transistor, a field effect transistor, or other switching device having the same characteristics. In the embodiments of the present disclosure, a thin film transistor is taken as an example for description. The source electrode and drain electrode of the transistor used here may be structurally symmetrical, so that the source electrode and the drain electrode may be structurally indistinguishable. In the embodiments of the present disclosure, in order to distinguish the two electrodes of the transistor except the gate electrode, one of the two electrodes is described as a first electrode and the other electrode is described as a second electrode.

In addition, the transistors in the embodiments of the present disclosure are all described by taking an N-type transistor as an example, and in this case, the first electrode of the transistor is a drain electrode and the second electrode is a source electrode. It should be noted that the present disclosure includes but is not limited thereto. For example, one or more transistors in the shift register unit provided by the embodiments of the present disclosure may also adopt a P-type transistor, and in this case, the first electrode of the transistor is the source electrode, and the second electrode is the drain electrode, the electrodes of transistors of the selected type need to be connected with reference to the electrodes of the corresponding transistors in the embodiments of the present disclosure, and high voltages or low voltages are provided to corresponding voltage terminals. In a case where an N-type transistor is used, an indium gallium zinc oxide (IGZO) may be used as an active layer of the thin film transistor, compared with a low temperature poly silicon (LTPS) or an amorphous silicon (such as a hydrogenated amorphous silicon) as the active layer of the thin film transistor, the size of the transistor is effectively reduced and a leakage current is prevented.

In the embodiments of the present disclosure, for example, in a case where each of the circuits is implemented by N-type transistors, the term "pull-up" means charging a node or an electrode of a transistor, such that an absolute value of the level of the node or the electrode is increased, thereby implementing an operation (for example, turning-on) of the corresponding transistor; the term "pull-down" means discharging a node or an electrode of a transistor, such that an absolute value of the level of the node or the electrode is lowered, thereby implementing an operation (for example, turning-off) of the corresponding transistor. For another example, in a case where each of the circuits is implemented by P-type transistors, the term "pull-up" means discharging an electrode of a node or a transistor, so that an absolute value of the level of the node or the electrode is lowered, thereby implementing an operation (for example, turning-on) of the corresponding transistor; the term "Pull down" means charging a node or an electrode of a transistor such that the absolute value of the level of the node or the electrode is increased, thereby implementing an operation (for example, turning-off) of the corresponding transistor.

In the following description, by taking the case where the above-described transistors are all N-type transistors as an example, in conjunction with the signal timing diagram shown in FIG. 4, the operation of the shift register unit shown in FIG. 3A and FIG. 3B at different phases (P1 to P4) will be described in detail. In the embodiments of the present disclosure, a case where the first voltage terminal V1 constantly outputs a high level, and the second voltage terminal V2 and the third voltage terminal V3 constantly output low levels is taken as an example. In addition, the following description is based on a case where a first signal terminal IN1 receives an input signal INT and a second signal terminal IN2 receives a reset signal RST. For example, "0" means a low level and "1" means a high level.

In a case where V4=1, V5=0 (Uth frame):
in a first phase P1, INT=1, RST=0, CLK=0, IN3=0, V4=1, V5=0.

In this case, since the first signal terminal IN1 outputs a high level, the second transistor M2 is turned on, thereby outputting a high level of the first voltage terminal V1 to the pull-up node PU. Under a control of a high potential of the pull-up node PU, the third transistor M3 is turned on to output a low level of the clock signal terminal CLK to a signal output terminal OP.

As shown in FIG. 3A, under a control of the high potential of the pull-up node PU, the fifth transistor M5 is turned on, under the control of the high level of the fourth voltage terminal V4, the fourth transistor M4 is turned on. However, since a width to length ratio of a channel of the fifth transistor M5 is greater than a width to length ratio of a channel of the fourth transistor M4, a potential of the first pull-down node PD1 is still pulled down to a low level of the third voltage terminal V3 through the fifth transistor M5. In this case, the fourteenth transistor M14 and the sixteenth transistor M16 are both in a turned-off state.

Under a control of the high level of the fourth voltage terminal V4, the thirteenth transistor M13 is turned on, and a potential of the second pull-down node PD2 is pulled down to a low level of the third voltage terminal V3; under a control of the low level of the fifth voltage terminal V5, the ninth transistor M9 is turned off. Under a control of the pull-up node PU, the tenth transistor M10 is turned on, and a potential of the second pull-down node PD2 is pulled down to a low level of the third voltage terminal V3. In this case, the fifteenth transistor M15 and the seventeenth transistor M17 are both in a turned-off state.

As shown in FIG. 3B, the seventh transistor M7 and the fifth transistor M5 are turned on under the control of the high potential of the pull-up node PU, and the sixth transistor M6 is turned on under the control of the high level of the fourth voltage terminal V4. However, since a width to length ratio of the channel of the seventh transistor M7 is greater than a width to length ratio of the channel of the sixth transistor M6, the gate electrode of the fourth transistor M4 is at a low level. The fourth transistor M4 is controlled to be turned off, so that the potential of the first pull-down node PD1 is still pulled down to the low level of the third voltage terminal V3 through the fifth transistor M5. In this case, the fourteenth transistor M14 and the sixteenth transistor M16 are both in a turned-off state.

Under the control of the high level of the fourth voltage terminal V4, the thirteenth transistor M13 is turned on, and the potential of the second pull-down node PD2 is pulled down to the low level of the third voltage terminal V3; Under the control of the low level of the fifth voltage terminal V5, the eleventh transistor M11 is turned off; Under the control of the pull-up node PU, the tenth transistor M10 is turned on, and the potential of the second pull-down node PD2 is pulled down to the low level of the third voltage terminal V3; Under the control of the pull-up node PU, the twelfth transistor M12 is turned on, and the ninth transistor M9 is controlled to be turned off. In this case, the fifteenth transistor M15 and the seventeenth transistor M17 are both in a turned-off state.

In addition, the third signal terminal IN3 inputs a low level, so that the eighteenth transistor M18 and the nineteenth transistor M19 are both turned off; the second signal terminal IN2 inputs a low level, so that the first transistor M1 is turned off.

In summary, the signal output terminal OP outputs a low level in the first phase P1 described above.

In a second phase P2, INT=0, RST=0, CLK=1, IN3=0, V4=1, V5=0.

In this case, since the first signal terminal IN1 outputs a low level, the second transistor M2 is in a turned-off state. Capacitor C charges the pull-up node PU such that the third transistor M3 remains a turned-on state. In this case, the high level of the clock signal terminal CLK is output to the signal output terminal OP through the third transistor M3. In addition, under the action of the bootstrapping effect of the capacitor C, the potential of the pull-up node PU is further increased (the potential of the terminal of the capacitor C connected to the signal output terminal OP jumps from 0 to 1, and at the time when the capacitor C charges the pull-up node PU, the potential of the pull-up node PU further jumps to a high potential on the basis of 1), thereby the third transistor M3 is brought into a fully turned-on state, the high level of the clock signal terminal CLK may be output as a gate scan signal to the gate line connected to the signal output terminal OP.

As shown in FIG. 3A, the fifth transistor M5 is turned on under the control of the high potential of the pull-up node PU, and the fourth transistor M4 is turned on under the control of the high level of the fourth voltage terminal V4. However, since the width to length ratio of the channel of the fifth transistor M5 is greater than the width to length ratio of the channel of the fourth transistor M4, the potential of the first pull-down node PD1 is still pulled down to the low level of the third voltage terminal V3 through the fifth transistor M5. In this case, the fourteenth transistor M14 and the sixteenth transistor M16 are both in a turned-off state.

Under the control of the high level of the fourth voltage terminal V4, the thirteenth transistor M13 is turned on, and the potential of the second pull-down node PD2 is pulled down to the low level of the third voltage terminal V3; the ninth transistor M9 is turned off under the control of the low level of the fifth voltage terminal V5, and the tenth transistor M10 is turned on under the control of the pull-up node PU, and the potential of the second pull-down node PD2 is pulled down to a low level of the third voltage terminal V3. In this case, the fifteenth transistor M15 and the seventeenth transistor M17 are both in a turned-off state.

As shown in FIG. 3B, under the control of the high potential of the pull-up node PU, the seventh transistor M7 and the fifth transistor M5 are turned on. The sixth transistor M6 is turned on under the control of the high level of the fourth voltage terminal V4. However, since the width to length ratio of the channel of the seventh transistor M7 is greater than the width to length ratio of the channel of the sixth transistor M6, the gate electrode of the fourth transistor M4 is at a low level, and the fourth transistor M4 is controlled to be turned off. The potential of the first pull-down node PD1 is still pulled down to the low level of the third voltage terminal V3 through the fifth transistor M5. In this case, the fourteenth transistor M14 and the sixteenth transistor MI6 are both in a turned-off state.

Under the control of the high level of the fourth voltage terminal V4, the thirteenth transistor M13 is turned on, and the potential of the second pull-down node PD2 is pulled down to the low level of the third voltage terminal V3; the eleventh transistor M11 is turned off under the control of the low level of the fifth voltage terminal V5; under the control of the pull-up node PU, the tenth transistor M10 is turned on, and the potential of the second pull-down node PD2 is pulled down to the low level of the third voltage terminal V3; under the control of the pull-up node PU, the twelfth transistor M12 is turned on, and the ninth transistor M9 is controlled to be turned off. In this case, the fifteenth transistor MI5 and the seventeenth transistor M17 are both in a turned-off state.

In addition, the third signal terminal IN3 inputs a low level, so that the eighteenth transistor M18 and the nineteenth transistor M19 are both turned off; the second signal terminal IN2 inputs a low level, so that the first transistor M1 is turned off.

In summary, the signal output terminal OP outputs a high level in the second phase P2 to output a gate scan signal to the gate line connected to the signal output terminal OP.

In a third phase P3, INT=0, RST=1, CLK=0, IN3=0, V4=1, V5=0.

In this case, since the second signal terminal IN2 outputs a high level, the first transistor M1 is turned on, thereby the potential of the pull-up node PU being pulled down to the low level of the second voltage terminal V2, and the third transistor M3 being in a turned-off state.

As shown in FIG. 3A, under the control of the low potential of the pull-up node PU, the fifth transistor M5 is turned off. The fourth transistor M4 is turned on under the control of the high level of the fourth voltage terminal V4, and outputs the high level of the fourth voltage terminal V4 to the first pull-down node PD1. Under the control of the high potential of the first pull-down node PD1, the fourteenth transistor M14 and the sixteenth transistor M16 are both turned on. The potential of the pull-up node PU is pulled down to the low level of the third voltage terminal V3 through the sixteenth transistor M16, and the potential of the signal output terminal OP is pulled down to the low level of the third voltage terminal V3 through the fourteenth transistor M14.

Under the control of the low potential of the pull-up node PU, the tenth transistor M10 is turned off; under the control of the low level of the fifth voltage terminal V5, the ninth transistor M9 and the eighth transistor M8 are both turned off; under the control of the high level of the fourth voltage terminal V4, the thirteenth transistor M13 is turned on, and the potential of the second pull-down node PD2 is pulled down to the low level of the third voltage terminal V3; and under the control of the second pull-down node PD2, the fifteenth transistor M15 and the seventeenth transistor M17 are both turned off.

As shown in FIG. 3B, under the control of the low potential of the pull-up node PU, the seventh transistor M7 and the fifth transistor M5 are both turned off. The sixth transistor M6 is turned on under the control of the high level of the fourth voltage terminal V4, and outputs the high level of the fourth voltage terminal V4 to the gate electrode of the fourth transistor M4 and controls the fourth transistor M4 to be turned on. The fourth transistor M4 outputs the high level of the fourth voltage terminal V4 to the first pull-down node PD1. Under the control of the high potential of the first pull-down node PD1, the fourteenth transistor M14 and the sixteenth transistor M16 are both turned on, thereby pulling down the potential of the pull-up node PU to the low level of the third voltage terminal V3 through the sixteenth transistor M16, and pulling down the potential of the signal output terminal OP to the low level of the third voltage terminal V3 through the fourteenth transistor M14.

Under the control of the low potential of the pull-up node PU, the tenth transistor M10 and the twelfth transistor M12 are both turned off; under the control of the low level of the fifth voltage terminal V5, the eleventh transistor M11, the ninth transistor M9 and the eighth transistor M8 are all turned off; under the control of the high level of the fourth voltage terminal V4, the thirteenth transistor M13 is turned on, and the potential of the second pull-down node PD2 is pulled down to the low level of the third voltage terminal V3; and under the control of the second pull-down node PD2, the fifteenth transistor M15 and the seventeenth transistor M17 are both turned off.

In addition, the first signal terminal IN1 inputs a low level, so that the second transistor M2 is turned off; and the third signal terminal IN3 inputs a low level, so that the eighteenth transistor M18 and the nineteenth transistor M19 are both turned off.

In a fourth phase P4, INT=0, RST=0, IN3=1, V4 changes from 1 to 0, and V5 changes from 0 to 1.

In this case, the third signal terminal IN3 inputs a high level, and the eighteenth transistor M18 and the nineteenth transistor M19 are both turned on. The eighteenth transistor M18 inputs a low level of the third voltage terminal V3 to the signal output terminal OP to perform noise reduction on the signal output terminal OP, and the nineteenth transistor M19 inputs the low level of the third voltage terminal V3 to the pull-up node PU to perform noise reduction on the pull-up node PU.

The third signal terminal IN3 may always input a high level throughout the fourth phase P4, or may input a high level pulse at the beginning and/or end of the fourth phase P4.

In this phase, except the eighteenth transistor M18 and the nineteenth transistor M19 being turned on, remaining transistors are in a turned-off state.

In a case where V4=0, V5=1 ((U+1)th frame):
in the first phase P1, INT=1, RST=0, CLK=0, IN3=0, V4=0, V5=1.

In this case, since the first signal terminal IN1 outputs a high level, the second transistor M2 is turned on to output the high level of the first voltage terminal V1 to the pull-up node PU. Under the control of the high potential of the pull-up node PU, the third transistor M3 is turned on to output the low level of the clock signal terminal CLK to the signal output terminal OP.

As shown in FIG. 3A, under the control of the high potential of the pull-up node PU, the tenth transistor M10 is turned on. The ninth transistor M9 is turned on under the control of the high level of the fifth voltage terminal V5. However, since the width to length ratio of the channel of the tenth transistor M10 is greater than the width to length ratio of the channel of the ninth transistor M9, the potential of the second pull-down node PD2 is still pulled down to the low level of the third voltage terminal V3 through the tenth transistor M10. In this case, the fifteenth transistor M15 and the seventeenth transistor M17 are both in a turned-off state.

Under the control of the high level of the fifth voltage terminal V5, the eighth transistor M8 is turned on to pull down the potential of the first pull-down node PD1 to the low level of the third voltage terminal V3; and under the control of the low level of the fourth voltage terminal V4, the fourth transistor M4 is turned off. Under the control of the pull-up node PU, the fifth transistor M5 is turned on, and the potential of the first pull-down node PD1 is pulled down to the low level of the third voltage terminal V3. In this case, the fourteenth transistor M14 and the sixteenth transistor M16 are both in a turned-off state.

As shown in FIG. 3B, under the control of the high potential of the pull-up node PU, the tenth transistor M10 and the twelfth transistor M12 are turned on. The eleventh transistor M11 is turned on under the control of the high level of the fifth voltage terminal V5. However, since the width to length ratio of the channel of the twelfth transistor M12 is greater than the width to length ratio of the channel of the eleventh transistor M11, the gate electrode of the ninth transistor M9 is at a low level. The ninth transistor M9 is controlled to be turned off, so that the potential of the second pull-down node PD2 is still pulled down to the low level of the third voltage terminal V3 through the tenth transistor M10. In this case, the fifteenth transistor M15 and the seventeenth transistor M17 are both in a turned-off state.

Under the control of the high level of the fifth voltage terminal V5, the eighth transistor M8 is turned on to pull down the potential of the first pull-down node PD1 to the low level of the third voltage terminal V3; the sixth transistor M6 is turned off under the control of the low level of the fourth voltage terminal V4; under the control of the pull-up node PU, the fifth transistor M5 is turned on, thereby pulling the potential of the first pull-down node PD1 to a low level of the third voltage terminal V3; and under the control of the pull-up node PU, the seventh transistor M7 is turned on, the fourth transistor M4 is controlled to be turned off. In this case, the fourteenth transistor M14 and the sixteenth transistor M16 are both in a turned-off state.

In addition, the third signal terminal IN3 inputs a low level, such that the eighteenth transistor M18 and the nineteenth transistor M19 are both turned off; and the second signal terminal IN2 inputs a low level, such that the first transistor M1 is turned off.

In summary, the signal output terminal OP outputs a low level in the first phase P1 described above.

In the second phase P2, INT=0, RST=0, CLK=1, IN3=0, V4=0, V5=1.

In this case, since the first signal terminal IN1 outputs a low level, the second transistor M2 is in a turned-off state. Capacitor C charges the pull-up node PU such that the third transistor M3 remains a turned-on state. In this case, the high level of the clock signal terminal CLK is output to the signal output terminal OP through the third transistor M3. In addition, under the action of the bootstrapping effect of the capacitor C, the potential of the pull-up node PU is further increased, so that the third transistor M3 is brought into a fully turned-on state, and the high level of the clock signal terminal CLK may be output as a gate scan signal to the gate line connected to the signal output terminal OP.

As shown in FIG. 3A, under the control of the high potential of the pull-up node PU, the tenth transistor M10 is turned on, and under the control of the high level of the fifth voltage terminal V5, the ninth transistor M9 is turned on. However, since the width to length ratio of the channel of the tenth transistor M10 is greater than the width to length ratio of the channel of the ninth transistor M9, the potential of the second pull-down node PD2 is still pulled down to the low level of the third voltage terminal V3 through the tenth transistor M10. In this case, the fifteenth transistor M15 and the seventeenth transistor M17 are both in a turned-off state.

Under the control of the high level of the fifth voltage terminal V5, the eighth transistor M8 is turned on to pull down the potential of the first pull-down node PD1 to the low level of the third voltage terminal V3; under the control of the low level of the fourth voltage terminal V4, the fourth transistor M4 is turned off; and under the control of the pull-up node PU, the fifth transistor M5 is turned on, the potential of the first pull-down node PD1 is pulled down to the low level of the third voltage terminal V3. In this case, the fourteenth transistor M14 and the sixteenth transistor M16 are both turned off.

As shown in FIG. 3B, under the control of the high potential of the pull-up node PU, the tenth transistor M10 and the twelfth transistor M12 are turned on. The eleventh transistor M11 is turned on under the control of the high level of the fifth voltage terminal V5. However, since the width to length ratio of the channel of the twelfth transistor M12 is greater than the width to length ratio of the channel of the eleventh transistor M11, the gate electrode of the ninth transistor M9 is at a low level. The ninth transistor M9 is controlled to be turned off, so that the potential of the second pull-down node PD2 is still pulled down to the low level of the third voltage terminal V3 through the tenth transistor M10. In this case, the fifteenth transistor M15 and the seventeenth transistor M17 are both in a turned-off state.

Under the control of the high level of the fifth voltage terminal V5, the eighth transistor M8 is turned on to pull down the potential of the first pull-down node PD1 to the low level of the third voltage terminal V3; the sixth transistor M6 is turned off under the control of the low level of the fourth voltage terminal V4; under the control of the pull-up node PU, the fifth transistor M5 is turned on to pull down the potential of the first pull-down node PD1 to a low level of the third voltage terminal V3; and under the control of the pull-up node PU, the seventh transistor M7 is turned on, and the fourth transistor M4 is controlled to be turned off. In this case, the fourteenth transistor M14 and the sixteenth transistor M16 are both in a turned-off state.

In addition, the third signal terminal IN3 inputs a low level, so that the eighteenth transistor M18 and the nineteenth transistor M19 are both turned off; and the second signal terminal IN2 inputs a low level, so that the first transistor M1 is turned off.

In summary, the signal output terminal OP outputs a high level in the second phase P2 to output a gate scan signal to the gate line connected to the signal output terminal OP.

In a third phase P3, INT=0, RST=1, CLK=0, IN3=0, V4=0, V5=1.

In this case, since the second signal terminal IN2 outputs a high level, the first transistor M1 is turned on, thereby pulling down the potential of the pull-up node PU to the low level of the second voltage terminal V2, so that the third transistor M3 is in a turned-off state.

As shown in FIG. 3A, under the control of the low potential of the pull-up node PU, the tenth transistor M10 is turned off. The ninth transistor M9 is turned on under the control of the high level of the fifth voltage terminal V5 and outputs the high level of the fifth voltage terminal V5 to the second pull-down node PD2. Under the control of the high potential of the second pull-down node PD2, the fifteenth transistor M15 and the seventeenth transistor M17 are both turned on, thereby pulling down the potential of the pull-up node PU to the low level of the third voltage terminal V3 through the seventeenth transistor M17, and pulling down the potential of the signal output terminal OP to the low level of the third voltage terminal V3 through the fifteenth transistor M15.

The fifth transistor M5 is turned off under the control of the low potential of the pull-up node PU; under the control of the low level of the fourth voltage terminal V4, the fourth transistor M4 and the thirteenth transistor M13 are both turned off; under the control of the high level of the fifth voltage terminal V5, the eighth transistor M8 is turned on, and the potential of the first pull-down node PD1 is pulled down to the low level of the third voltage terminal V3; and under the control of the first pull-down node PD1, the fourteenth transistor M14 and the sixteenth transistor M16 are both turned off.

As shown in FIG. 3B, under the control of the low potential of the pull-up node PU, the tenth transistor M10 and the twelfth transistor M12 are both turned off. The eleventh transistor M11 is turned on under the control of the high level of the fifth voltage terminal V5, and outputs the high level of the fifth voltage terminal V5 to the gate electrode of the ninth transistor M9 to control the ninth transistor M9 to be turned on, and the ninth transistor M9 outputs the high level of the fifth voltage terminal V5 to the second pull-down node PD2. Under the control of the high potential of the second pull-down node PD2, the fifteenth transistor M15 and the seventeenth transistor M17 are both turned on, thereby pulling down the potential of the pull-up node PU to the low level of the third voltage terminal V3 through the seventeenth transistor M17, and pulling down the potential of the signal output terminal OP to the low level of the third voltage terminal V3 through the fifteenth transistor M15.

Under the control of the low potential of the pull-up node PU, the fifth transistor M5 and the seventh transistor M7 are both turned off; the sixth transistor M6, the fourth transistor M4 and the thirteenth transistor M13 are both turned off under the control of the low level of the fourth voltage terminal V4; under the control of the high level of the fifth voltage terminal V5, the eighth transistor M8 is turned on, and the potential of the first pull-down node PD1 is pulled down to the low level of the third voltage terminal V3; and under the control of the first pull-down node PD1, the fourteenth transistor M14 and the sixteenth transistor M16 are both turned off.

In addition, the first signal terminal IN1 inputs a low level, so that the second transistor M2 is turned off; and the third signal terminal IN3 inputs a low level, so that the eighteenth transistor M18 and the nineteenth transistor M19 are both turned off.

In a fourth phase P4, INT=0, RST=0, IN3=1, V4 changes from 0 to 1, and V5 changes from 1 to 0.

In this case, the third signal terminal IN3 inputs a high level, and the eighteenth transistor M18 and the nineteenth transistor M19 are both turned on. The eighteenth transistor M18 inputs a low level of the third voltage terminal V3 to the signal output terminal OP to perform noise reduction on the signal output terminal OP. The nineteenth transistor M19 inputs the low level of the third voltage terminal V3 to the pull-up node PU to perform noise reduction on the pull-up node PU.

The third signal terminal IN3 may always input a high level throughout the fourth phase P4, or may input a high level pulse at the beginning and/or end of the fourth phase P4.

The change of the fourth voltage terminal V4 and the fifth voltage terminal V5 may be performed at any time in the fourth phase P4.

In this phase, except the eighteenth transistor M18 and the nineteenth transistor M19 being turned on, the other transistors are in a turned-off state.

It should be noted that, firstly, the turning-on and turning-off processes of the transistors in the above embodiments are described by taking the case where all transistors are N-type transistors as an example. In a case where all the transistors are P-type transistors, it is necessary to change the level of each control signal in FIG. 4 (for example, making a high level to be a low level and making a low level to a high level), the turning-on and turning-off processes of individual transistors in the shift register unit are the same as those described above, which are not repeated herein.

Secondly, the operation of the shift register unit is described by taking the case where the gate driving circuit formed by cascading the plurality of shift register units performs forward scans as an example. In a case where a reverse scan is performed, in the shift register unit shown in FIG. 3A and FIG. 3B, the first signal terminal IN1 may receive a reset signal RST, and the second signal terminal IN2 may receive a input signal INT. In addition, the first voltage terminal V1 inputs a low level, and the second voltage terminal V2 inputs a high level.

Figure 5:
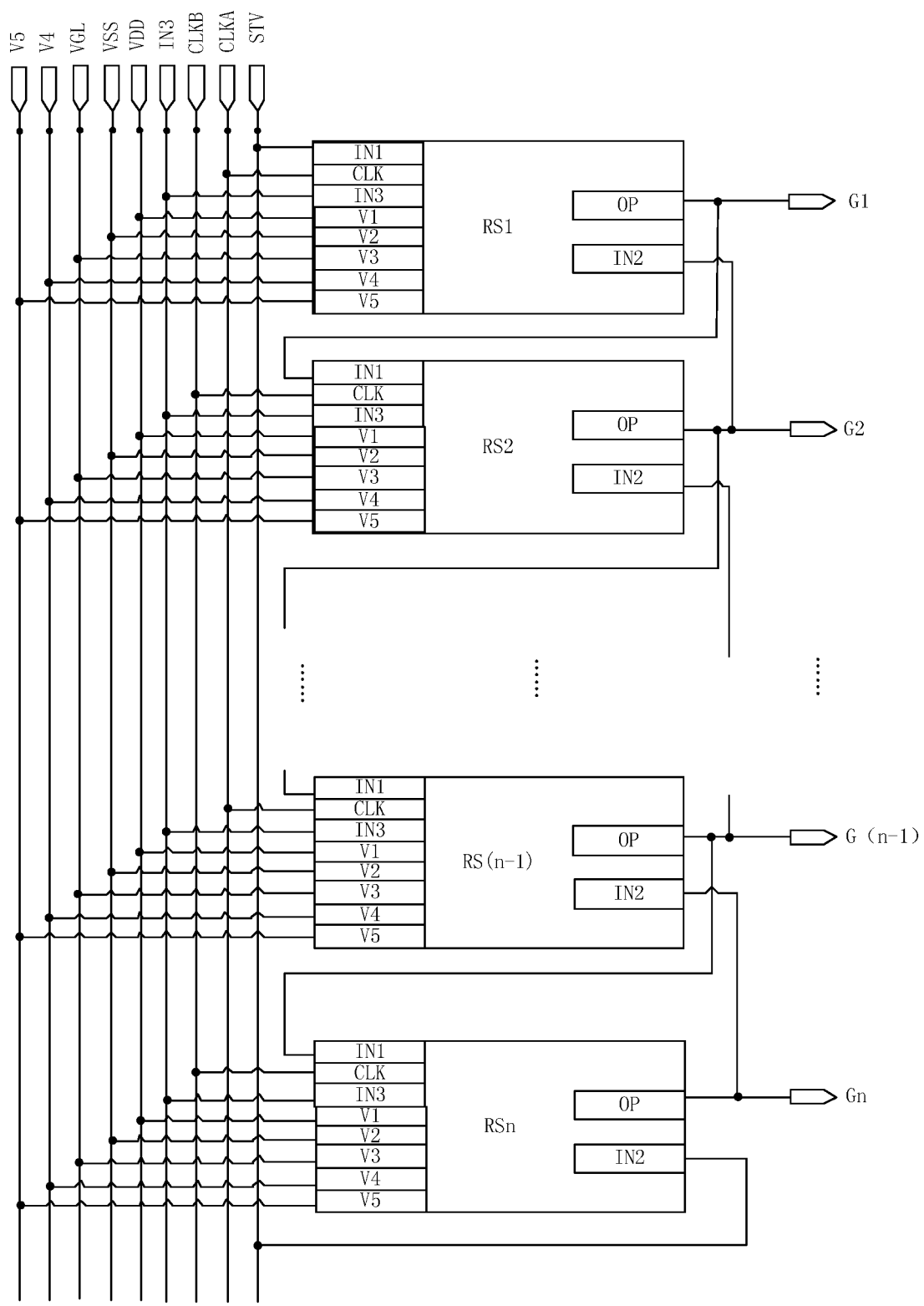
FIG. 5 is a schematic structural diagram of a gate driving circuit according to an embodiment of the present disclosure.

At least one embodiment of the present disclosure also provides a gate driving circuit, As shown in FIG. 5, the gate driving circuit includes a plurality of cascaded shift register units (RS1, RS2, . . . , RSn) as described in the above embodiments.

The first signal terminal IN1 of the shift register unit RS1 of the first stage is connected to the start signal terminal STY. Except the first stage shift register unit RS1, the signal output terminal OP of the shift register unit RS(n−1) of the previous stage is connected to the first signal terminal IN1 of the shift register unit RS(n) of the next stage. The start signal terminal STV is used to output a start signal, and the shift register unit RS1 of the first stage of the gate driving circuit starts to perform a line-by-line scan on gate lines (G1, G2, . . . , Gn) after receiving the start signal above-described.

In addition, except the shift register unit RSn of the last stage, the second signal terminal IN2 of the shift register unit of a previous stage is connected to the signal output terminal OP of the shift register unit of the next stage, and the second signal terminal IN2 of the shift register unit RSn of the last stage is connected to the above-described start signal terminal STY. In this way, in a case where the start signal of the start signal terminal STV is input to the first signal terminal IN1 of the shift register unit RS1 of the first stage, and the second signal terminal IN2 of the shift register unit RSn of the last stage may reset the signal output terminal OP of the shift register unit RSn of the last stage by using the start signal of the start signal terminal STV as a reset signal.

In this case, the second signal terminal IN2 of the shift register unit RSn of the last stage may also be connected to a separately arranged reset signal line.

On this basis, the first voltage terminal V1 of the shift register unit of each stage is connected to a high level VDD, the second voltage terminal V2 of the shift register unit of each stage is connected to a low level VSS, and the third voltage terminal V3 of the shift register unit of each stage is connected to a low level VGL.

In addition, the gate driving circuit shown in FIG. 5 shows the connections of individual control signals in a case where the gate lines are forward-scanned. In a case where the gate lines are reversely scanned by the gate driving circuit, the second signal terminal IN2 of the shift register unit RS1 of the first stage is connected to the start signal terminal STY. Except the shift register unit RS1 of the first stage, the signal output terminal OP of the shift register unit RS(n−1) of a next stage is connected to the second signal terminal IN2 of the shift register unit RS(n) of a previous stage. Except the shift register unit RSn of the last stage, the first signal terminal IN1 of the shift register unit of a previous stage is connected to the signal output terminal OP of the shift register unit of a next stage. The first signal terminal IN1 of the shift register unit RSn of the last stage is connected to the above-mentioned start signal terminal STY.

On this basis, the first voltage terminal V1 of the shift register unit of each stage is connected to the low level VSS, the second voltage terminal V2 is connected to the high level VDD, and the third voltage terminal V3 is connected to the low level VGL.

As shown in FIG. 5, the fourth voltage terminals V4 of all the shift register units in the gate driving circuit are controlled by the same signal terminal, and the fifth voltage terminals V5 of all the shift register units are also controlled by the same signal terminal.

At least one embodiment of the present disclosure also provides a display device including any of the above-described gate driving circuits, and having the same structure and advantageous effects as the gate driving circuit provided in the foregoing embodiments.

Figure 6A:
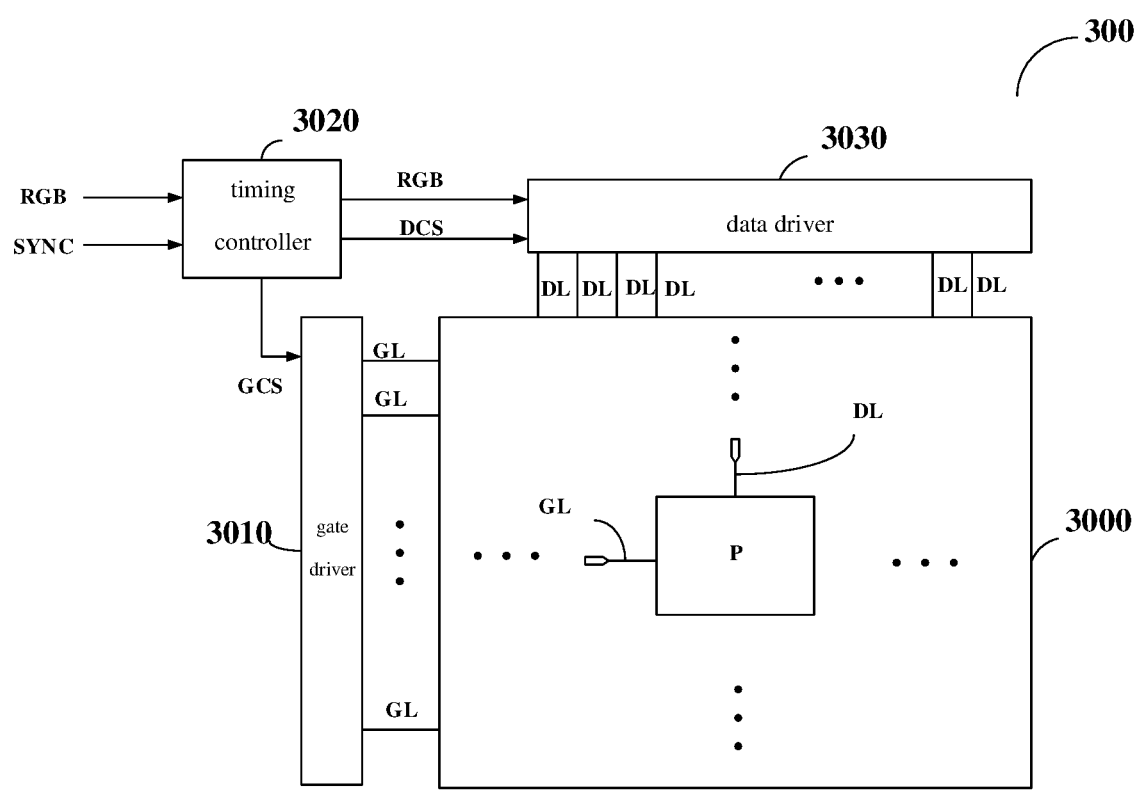
FIG. 6A is a schematic block diagram of a display device according to an embodiment of the present disclosure.

FIG. 6A is a schematic block diagram of a display device according to an embodiment of the present disclosure. Referring to FIG. 6A, the display device 300 includes a display panel 3000, a gate driver 3010, a timing controller 3020 and a data driver 3030. The display panel 3000 includes a plurality of pixel units P defined by a plurality of scan lines GL and a plurality of data lines DL. The gate driver 3010 is configured to drive a plurality of scan lines GL. The data driver 3030 is configured to drive a plurality of data lines DL. The timing controller 3020 is configured to process image data RGB input from outside the display device 300 to provide the processed image data RGB to the data driver 3030 and output the scan control signal GCS and the data control signal DCS to the gate driver 3010 and the data driver 3030, so as to control the gate driver 3010 and the data driver 3030.

For example, the gate driver 3010 includes the gate driving circuit provided in any of the above embodiments. The output terminals OP of the plurality of shift register units in the gate driving circuit are correspondingly connected to the plurality of scanning lines GL. The plurality of scanning lines GL are connected to the pixel units P arranged in a plurality of rows. The output terminals OP of the shift register units of each of the stages in the gate driving circuit sequentially output signals to the plurality of scanning lines GL to enable a line-by-line scan of the plurality of rows of pixel units P in the display panel 3000. For example, the gate driver 3010 may be implemented as a semiconductor chip or may be integrated on the display panel 3000 to constitute a GOA circuit.

For example, the data driver 3030 converts the digital image data RGB input from the timing controller 3020 into a data signal according to a plurality of data control signals DCS from the timing controller 3020 by using a reference gamma voltage. The data driver 3030 provides the converted data signals to the plurality of data lines DL. For example, the data driver 3030 may be implemented as a semiconductor chip.

For example, the timing controller 3020 processes an externally input image data RGB to match the size and the resolution of the display panel 3000, and then provides the processed image data to the data driver 3030. The timing controller 3020 generates a plurality of scan control signals GCS and a plurality of data control signals DCS using synchronization signals (for example, a dot clock DCLK, a data enable signal DE, a horizontal synchronization signal Hsync and a vertical synchronization signal Vsync) input from outside the display device 300. The timing controller 3020 respectively provides the generated scan control signals GCS and data control signals DCS to the gate driver 3010 and the data driver 3030 to control the gate driver 3010 and the data driver 3030.

The display device 300 may further include other components, such as a signal decoding circuit, a voltage conversion circuit, etc. These components may be, for example, conventional components, which will not be described in detail herein.

For example, the display device 300 may be any product or component with a display function such as a liquid crystal display (LCD) panel, an LCD TV, a display, an Organic Light-Emitting Diode (OLED) panel, an OLED TV, an electronic paper display device, a mobile phone, a tablet computer, a notebook computer, a digital photo frame, a navigator, and the embodiments of the present disclosure are limited thereto. The technical effects of the display device 300 may refer to the corresponding descriptions of the shift register unit and the gate driving circuit in the above embodiments, and details are not described herein again.

Figure 4:
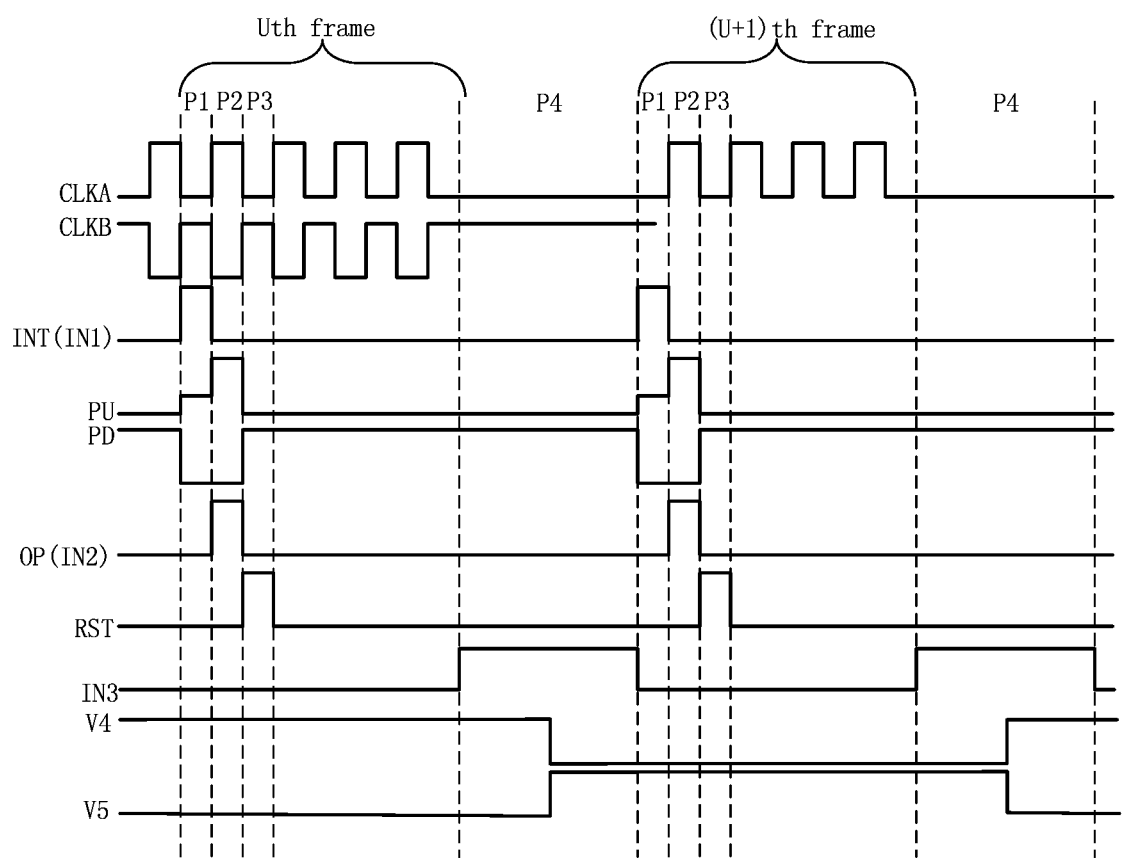
FIG. 4 is a signal timing diagram for controlling the shift register unit shown in FIG. 3A or FIG. 3B.

At least one embodiment of the present disclosure also provides a method of driving any one of the above shift register units, for example, in a case where V4=1, V5=0 (Uth frame), the method includes:
in the first phase P1 shown in FIG. 4:
under the control of the first signal terminal IN1, the first input circuit 10 outputs the voltage of the first voltage terminal V1 to the pull-up node PU. Under the control of the pull-up node PU, the output circuit 30 outputs a clock signal of the clock signal terminal CLK (in this case, a low potential signal) to the signal output terminal OP.

In addition, the first pull-down control circuit 40 pulls down the potential of the first pull-down node PD1 to the low potential of the third voltage terminal V3 under the control of a high level of the fourth voltage terminal V4 and a high potential of the pull-up node PU. The third pull-down control circuit 60 pulls down the potential of the second pull-down node PD2 to the low potential of the third voltage terminal V3 under the control of the low level of the fifth voltage terminal V5 and the high potential of the pull-up node PU. The fourth pull-down control circuit 70 pulls down the potential of the second pull-down node PD2 to the low potential of the third voltage terminal V3 under the control of the high level of the fourth voltage terminal V4. In this case, the second input circuit 20, the second pull-down control circuit 50, the first pull-down circuit 80, the second pull-down circuit 90, the first noise reduction circuit 100, the second noise reduction circuit 110 and the reset circuit 120 are not turned on.

In a case where the structure of each circuit in the above shift register unit is as shown in FIG. 3A or FIG. 3B and the transistors in each circuit are N-type transistors, as shown in FIG. 4, in the first phase P1, the clock signal terminal CLK inputs a low level, the first signal terminal IN1 inputs a high level, the second signal terminal IN2 inputs a low level, the third signal terminal IN3 inputs a low level, the fourth voltage terminal V4 inputs a high voltage, the fifth voltage terminal V5 inputs a low voltage, the pull-up node PU is at a high level, first pull-down node PD1 and second pull-down node PD2 are at a low level, the signal output terminal OP output a low level.

Based on this, the first signal terminal IN1 inputs a high level, the first input circuit 10 outputs the high level of the first voltage terminal V1 to the pull-up node PU under the control of the high level of the first signal terminal IN1. For example, in the first phase P1, the states of the transistors in each of the above circuits are as follows: since the first signal terminal IN1 outputs a high level, the second transistor M2 is turned on, thereby outputting the high level of the first voltage terminal V1 to the pull-up node PU. Under the control of the pull-up node PU, the third transistor M3 is turned on, and the low level of the clock signal terminal CLK is output to the signal output terminal OP.

As shown in FIG. 3A, under the control of the high potential of the pull-up node PU, the fifth transistor M5 is turned on. The fourth transistor M4 is turned on under the control of the high level of the fourth voltage terminal V4. However, since the width to length ratio of the channel of the fifth transistor M5 is greater than the width to length ratio of the channel of the fourth transistor M4, the potential of the first pull-down node PD1 is still pulled down to the low level of the third voltage terminal V3 through the fifth transistor M5. In this case, the fourteenth transistor M14 and the sixteenth transistor M16 are both in a turned-off state.

Under the control of the high level of the fourth voltage terminal V4, the thirteenth transistor M13 is turned on, and the potential of the second pull-down node PD2 is pulled down to the low level of the third voltage terminal V3; under the control of the low level of the fifth voltage terminal V5, the ninth transistor M9 is turned off. Under the control of the pull-up node PU, the tenth transistor M10 is turned on, the potential of the second pull-down node PD2 is pull down to a low level of the third voltage terminal V3. In this case, the fifteenth transistor M15 and the seventeenth transistor M17 are both in a turned-off state.

As shown in FIG. 3B, under the control of the high potential of the pull-up node PU, the seventh transistor M7 and the fifth transistor M5 are turned on. The sixth transistor M6 is turned on under the control of the high level of the fourth voltage terminal V4. However, since the width to length ratio of the channel of the seventh transistor M7 is greater than the width to length ratio of the channel of the sixth transistor M6, the gate electrode of the fourth transistor M4 is at a low level. The fourth transistor M4 is controlled to be turned off, so that the potential of the first pull-down node PD1 is still pulled down to the low level of the third voltage terminal V3 through the fifth transistor M5. In this case, the fourteenth transistor M14 and the sixteenth transistor M16 are both in a turned-off state.

Under the control of the high level of the fourth voltage terminal V4, the thirteenth transistor M13 is turned on, and the potential of the second pull-down node PD2 is pulled down to the low level of the third voltage terminal V3. The eleventh transistor M11 is turned off under the control of the low level of the fifth voltage terminal V5. Under the control of the pull-up node PU, the tenth transistor M10 is turned on, and the potential of the second pull-down node PD2 is pulled down to the low level of the third voltage terminal V3. Under the control of the pull-up node PU, the twelfth transistor M12 is turned on, and the ninth transistor M9 is controlled to be turned off. In this case, the fifteenth transistor M15 and the seventeenth transistor M17 are both in a turned-off state.

In addition, the third signal terminal IN3 inputs a low level, so that the eighteenth transistor M18 and the nineteenth transistor M19 are both turned off; the second signal terminal IN2 inputs a low level, so that the first transistor M1 is turned off.

In the second phase P2:
under the control of the pull-up node PU, the output circuit 30 outputs a clock signal of the clock signal terminal CLK (in this case, a high potential signal) to the signal output terminal OP, and the signal output terminal OP outputs a gate scan signal.

In addition, the first pull-down control circuit 40 and the third pull-down control circuit 60 pull down the potentials of the first pull-down node PD1 and the second pull-down node PD2 to a low potential of the third voltage terminal V3 under the control of a high potential of the pull-up node PU. In this case, the first input circuit 10, the second input circuit 20, the second pull-down control circuit 50, the first pull-down circuit 80, the second pull-down circuit 90, the first noise reduction circuit 100, the second noise reduction circuit 110 and the reset circuit 120 are not turned on.

In a case where the structure of each circuit in the above shift register unit is as shown in FIG. 3A or FIG. 3B and the transistors in each of the circuits are N-type transistors, as shown in FIG. 4, in the second phase P2, the first signal terminal IN1 inputs a low level, the second signal terminal IN2 inputs a low level, the third signal terminal IN3 inputs a low level, the fourth signal terminal IN3 inputs a low level, and the fourth voltage terminal V4 inputs a high voltage, the fifth voltage terminal V5 inputs a low voltage; the pull-up node PU is at a high level, the first pull-down node PD1 and the second pull-down node PD2 are at a low level, and the signal output terminal OP outputs a high level.

Since the first signal terminal IN1 outputs a low level, the second transistor M2 is in a turned-off state. The capacitor C charges the pull-up node PU such that the third transistor M3 remains a turned-on state. In this case, the high level of the clock signal terminal CLK is output to the signal output terminal OP through the third transistor M3. In addition, under the action of the bootstrapping effect of the capacitor C, the potential of the pull-up node PU is further increased to maintain the third transistor M3 in a fully turned-on state, so that the high level of the clock signal terminal CLK may be output as a gate scan signal to the gate line connected to the signal output terminal OP.

As shown in FIG. 3A, under the control of the high potential of the pull-up node PU, the fifth transistor M5 is turned on. The fourth transistor M4 is turned on under the control of the high level of the fourth voltage terminal V4. However, since the width to length ratio of the channel of the fifth transistor M5 is greater than the width to length ratio of the channel of the fourth transistor M4, the potential of the first pull-down node PD1 is still pulled down to the low level of the third voltage terminal V3 through the fifth transistor M5. In this case, the fourteenth transistor M14 and the sixteenth transistor M16 are both in a turned-off state.

Under the control of the high level of the fourth voltage terminal V4, the thirteenth transistor M13 is turned on, and the potential of the second pull-down node PD2 is pulled down to the low level of the third voltage terminal V3. Under the control of the low level of the fifth voltage terminal V5, the ninth transistor M9 is turned off. Under the control of the pull-up node PU, the tenth transistor M10 is turned on, and the potential of the second pull-down node PD2 is pulled down to the low level of the third voltage terminal V3. In this case, the fifteenth transistor M15 and the seventeenth transistor M17 are both in a turned-off state.

As shown in FIG. 3B, under the control of the high potential of the pull-up node PU, the seventh transistor M7 and the fifth transistor M5 are turned on. The sixth transistor M6 is turned on under the control of the high level of the fourth voltage terminal V4. However, since the width to length ratio of the channel of the seventh transistor M7 is greater than the width to length ratio of the channel of the sixth transistor M6, the gate electrode of the fourth transistor M4 is at a low level, the fourth transistor M4 is controlled to be turned off, so that the potential of the first pull-down node PD1 is still pulled down to the low level of the third voltage terminal V3 through the fifth transistor M5. In this case, the fourteenth transistor M14 and the sixteenth transistor M16 are both in a turned-off state.

Under the control of the high level of the fourth voltage terminal V4, the thirteenth transistor M13 is turned on, and the potential of the second pull-down node PD2 is pulled down to the low level of the third voltage terminal V3. The eleventh transistor M11 is turned off under the control of the low level of the fifth voltage terminal V5. Under the control of the pull-up node PU, the tenth transistor M10 is turned on, and the potential of the second pull-down node PD2 is pulled down to the low level of the third voltage terminal V3. Under the control of the pull-up node PU, the twelfth transistor M12 is turned on, and the ninth transistor M9 is controlled to be turned off. In this case, the fifteenth transistor M15 and the seventeenth transistor M17 are both in a turned-off state.

In addition, the third signal terminal IN3 inputs a low level, so that the eighteenth transistor M18 and the nineteenth transistor M19 are both turned off. The second signal terminal IN2 inputs a low level, so that the first transistor M1 is turned off.

The third phase P3:
under the control of the second signal terminal IN2, the second input circuit 20 outputs the voltage of the second voltage terminal V2 to the pull-up node PU, and the control output circuit 30 is turned off. The first pull-down control circuit 40 outputs a turn-on voltage input by the fourth voltage terminal V4 to the first pull-down node PD1 under the control of the pull-up node PU and the turn-on voltage (high level signal) input by the fourth voltage terminal V4. Under the control of the first pull-down node PD1, the first pull-down circuit 80 outputs the voltage of the third voltage terminal V3 to the signal output terminal OP, and the first noise reduction circuit 100 outputs the voltage of the third voltage terminal V3 to the pull-up node PU. Under the control of the fourth voltage terminal V4, the fourth pull-down control circuit 70 outputs the voltage of the third voltage terminal V3 to the second pull-down node PD2.

At this phase, the first input circuit 10, the second pull-down control circuit 50, the third pull-down control circuit 60, the second pull-down circuit 90, the second noise reduction circuit 110 and the reset circuit 120 are not turned on.

In a case where the structure of each of the circuits in the above shift register unit is as shown in FIG. 3A or FIG. 3B, and the transistors in each of the circuits are N-type transistors, as shown in FIG. 4, in the third phase P3, the clock signal terminal CLK inputs a low level, the first signal terminal IN1 inputs a low level, the second signal terminal IN2 inputs a high level, the third signal terminal IN3 inputs a low level, the fourth signal terminal IN4 inputs a high level, the fourth voltage terminal V4 inputs a high level, and the fifth voltage terminals V5 inputs a low level; and the pull-up node PU is at a low level, the first pull-down node PD1 is at a high level, the second pull-down node PD2 is at a low level, and the signal output terminal OP outputs a low level.

Based on this, the first pull-down control circuit 40 outputs the high level of the fourth voltage terminal V4 to the first pull-down node PD1, and under the control of the first pull-down node PD1, the first pull-down circuit 80 outputs the low level of the third voltage terminal V3 to the signal output terminal OP, and the first noise reduction circuit 100 outputs a low level of the third voltage terminal V3 to the pull-up node PU. For example, in the third phase P3, the states of the transistors in each of the above circuits are as follows: since the second signal terminal IN2 outputs a high level, the first transistor M1 is turned on, so that the potential of the pull-up node PU is pulled down to the low level of the second voltage terminal V2, so that the third transistor M3 is in a turned-off state.

As shown in FIG. 3A, under the control of the low potential of the pull-up node PU, the fifth transistor M5 is turned off. The fourth transistor M4 is turned on under the control of the high level of the fourth voltage terminal V4, and outputs the high level of the fourth voltage terminal V4 to the first pull-down node PD1. Under the control of the high potential of the first pull-down node PD1, the fourteenth transistor M14 and the sixteenth transistor M16 are both turned on, the potential of the pull-up node PU is pulled down to the low level of the third voltage terminal V3 through the sixteenth transistor M16, and the potential of the signal output terminal OP is pulled down to the low level of the third voltage terminal V3 through the fourteenth transistor M14.

Under the control of the low potential of the pull-up node PU, the tenth transistor M10 is turned off. Under the control of the low level of the fifth voltage terminal V5, the ninth transistor M9 and the eighth transistor M8 are both turned off. Under the control of the high level of the fourth voltage terminal V4, the thirteenth transistor M13 is turned on, and the potential of the second pull-down node PD2 is pulled down to the low level of the third voltage terminal V3. Under the control of the second pull-down node PD2, the fifteenth transistor M15 and the seventeenth transistor M17 are both turned off.

As shown in FIG. 3B, under the control of the low potential of the pull-up node PU, the seventh transistor M7 and the fifth transistor M5 are both turned off, the sixth transistor M6 is turned on under the control of the high level of the fourth voltage terminal V4, and outputs the high level of the fourth voltage terminal V4 to the gate electrode of the fourth transistor M4 to control the fourth transistor M4 to be turned on, and the fourth transistor M4 outputs the high level of the fourth voltage terminal V4 to the first pull-down node PD1. Under the control of the high potential of the first pull-down node PD1, the fourteenth transistor M14 and the sixteenth transistor M16 are both turned on. The potential of the pull-up node PU is pulled down to the low level of the third voltage terminal V3 through the sixteenth transistor M16, and the potential of the signal output terminal OP is pulled down to the low level of the third voltage terminal V3 through the fourteenth transistor M14.

Under the control of the low potential of the pull-up node PU, the tenth transistor M10 and the twelfth transistor M12 are both turned off. Under the control of the low level of the fifth voltage terminal V5, the eleventh transistor M11, the ninth transistor M9 and the eighth transistor M8 are all turned off. Under the control of the high level of the fourth voltage terminal V4, the thirteenth transistor M13 is turned on, and the potential of the second pull-down node PD2 is pulled down to the low level of the third voltage terminal V3. Under the control of the second pull-down node PD2, the fifteenth transistor M15 and the seventeenth transistor M17 are both turned off.

In addition, the first signal terminal IN1 inputs a low level, so that the second transistor M2 is turned off. The third signal terminal IN3 inputs a low level, so that the eighteenth transistor M18 and the nineteenth transistor M19 are both turned off.

In the fourth phase P4:
under the control of the third signal terminal IN3, the reset circuit 120 outputs the voltage of the third voltage terminal V3 to the pull-up node PU and the signal output terminal OP to reset the pull-up node PU, turn off the output circuit 30 and perform noise reduction on the signal output terminal OP.

In this case, at this phase, the first input circuit 10, the second input circuit 20, the first pull-down control circuit 40, the second pull-down control circuit 50, the third pull-down control circuit 60, the fourth pull-down control circuit 70, the first pull-down circuit 80, the second pull-down circuit 90, the first noise reduction circuit 100 and the second noise reduction circuit 110 are not turned on.

In a case where the structure of each circuit in the above shift register unit is as shown in FIG. 3A or FIG. 3B and the transistors in each of the circuits are N-type transistors, as shown in FIG. 4, in the fourth phase P4, the first signal terminal IN1 inputs a low level, the second signal terminal IN2 inputs a low level, and the third signal terminal IN3 inputs a high level, the fourth voltage terminal V4 changes from a high level to a low level, and the fifth voltage terminal V5 changes from a low level to a high level. The pull-up node PU is at a low level, the first pull-down node PD1 and the second pull-down node PD2 are at a low level, and the signal output terminal OP outputs a low level.

Based on this, the high level of the clock signal terminal CLK cannot be output, and under the control of the third signal terminal IN3, the reset circuit 120 pulls down the voltages of the pull-up node PU and the signal output terminal OP to a low level of the third voltage terminal V3. For example, in the fourth phase P4, the states of the transistors in each of the above circuits are as follows: the third signal terminal IN3 inputs a high level, the eighteenth transistor M18 and the nineteenth transistor M19 are both turned on, the eighteenth transistor M18 inputs a low level of the third voltage terminal V3 to the signal output terminal OP to perform noise reduction on the signal output terminal OP. The nineteenth transistor M19 inputs the low level of the third voltage terminal V3 to the pull-up node PU to perform noise reduction on the pull-up node PU.

In this phase, except the eighteenth transistor M18 and the nineteenth transistor M19 being turned on, remaining transistors are in a turned-off state.

Figure 6B:
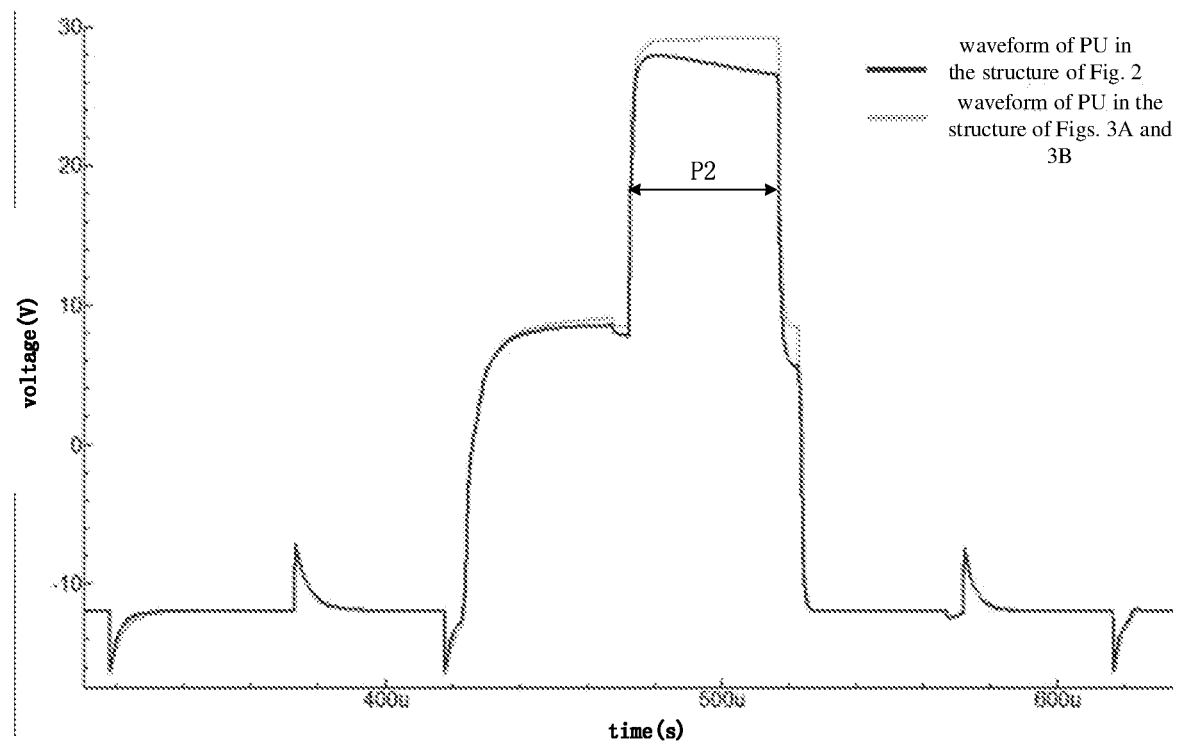
FIG. 6B is a waveform diagram of a pull-up node of the shift register unit shown in FIGS. 2, 3A and 3B.

A waveform diagram of the pull-up node PU in the shift register unit provided by the embodiment of the present disclosure is as shown in FIG. 6B. In the second phase P2, the potential of the pull-up node PU is relatively stable.

In a case where V4=0, V5=1 (the (U+1)th frame), the method includes:
in the first phase P1 shown in FIG. 4:
under the control of the first signal terminal IN1, the first input circuit 10 outputs the voltage of the first voltage terminal V1 to the pull-up node PU. Under the control of the pull-up node PU, the output circuit 30 outputs a clock signal of the clock signal terminal CLK (in this case, a low potential signal) to the signal output terminal OP.

In addition, the first pull-down control circuit 40 pulls down the potential of the first pull-down node PD1 to the low potential of the third voltage terminal V3 under the control of the low level of the fourth voltage terminal V4 and the high potential of the pull-up node PU. The second pull-down control circuit 50 pulls down the potential of the first pull-down node PD1 to the low potential of the third voltage terminal V3 under the control of the high level of the fifth voltage terminal V5. The third pull-down control circuit 60 pulls down the potential of the second pull-down node PD2 to the low potential of the third voltage terminal V3 under the control of the high level of the fifth voltage terminal V5 and the high potential of the pull-up node PU.

In this case, the second input circuit 20, the fourth pull-down control circuit 70, the first pull-down circuit 80, the second pull-down circuit 90, the first noise reduction circuit 100, the second noise reduction circuit 110 and the reset circuit 120 are not turned on.

In a case where the structure of each circuit in the above shift register unit is as shown in FIG. 3A or FIG. 3B and the transistors in each of the circuits are N-type transistors, as shown in FIG. 4, in the first phase P1, the clock signal terminal CLK inputs a low level, the first signal terminal IN1 inputs a high level, the second signal terminal IN2 inputs a low level, and the third signal terminal IN3 inputs a low level, the fourth voltage terminal V4 inputs a low voltage, the fifth voltage terminal V5 inputs a high voltage, the pull-up node PU is at a high level, the first pull-down node PD1 and the second pull-down node PD2 are at a low level, and the signal output terminal OP outputs a low level.

Based on this, the first signal terminal IN1 inputs a high level, and the first input circuit 10 outputs the high level of the first voltage terminal V1 to the pull-up node PU under the control of the high level of the first signal terminal IN1. For example, in the first phase P1, the states of the transistors in the respective circuits are as follows: since the first signal terminal IN1 outputs a high level, the second transistor M2 is turned on, so that the high level of the first voltage terminal V1 is output to the pull-up node PU. Under the control of the pull-up node PU, the third transistor M3 is turned on, and the low level of the clock signal terminal CLK is output to the signal output terminal OP.

As shown in FIG. 3A, under the control of the high potential of the pull-up node PU, the tenth transistor M10 is turned on. The ninth transistor M9 is turned on under the control of the high level of the fifth voltage terminal V5. However, since the width to length ratio of the channel of the tenth transistor M10 is greater than the width to length ratio of the channel of the ninth transistor M9, the potential of the second pull-down node PD2 is still pulled down to the low level of the third voltage terminal V3 through the tenth transistor M10. In this case, the fifteenth transistor M15 and the seventeenth transistor M17 are both in a turned-off state.

Under the control of the high level of the fifth voltage terminal V5, the eighth transistor M8 is turned on, the potential of the first pull-down node PD1 is pulled down to the low level of the third voltage terminal V3. Under the control of the low level of the fourth voltage terminal V4, the fourth transistor M4 is turned off. Under the control of the pull-up node PU, the fifth transistor M5 is turned on, and the potential of the first pull-down node PD1 is pulled down to the low level of the third voltage terminal V3. In this case, the fourteenth transistor M14 and the sixteenth transistor M16 are both in a turned-off state.

As shown in FIG. 3B, under the control of the high potential of the pull-up node PU, the tenth transistor M10 and the twelfth transistor M12 are turned on. The eleventh transistor M11 is turned on under the control of the high level of the fifth voltage terminal V5. However, since the width to length ratio of the channel of the twelfth transistor M12 is greater than the width to length ratio of the channel of the eleventh transistor M11, the gate electrode of the ninth transistor M9 is at a low level. The ninth transistor M9 is controlled to be turned off, such that the potential of the second pull-down node PD2 is still pulled down to the low level of the third voltage terminal V3 through the tenth transistor M10. In this case, the fifteenth transistor M15 and the seventeenth transistor M17 are both in a turned-off state.

Under the control of the high level of the fifth voltage terminal V5, the eighth transistor M8 is turned on to pull down the potential of the first pull-down node PD1 to the low level of the third voltage terminal V3. The sixth transistor M6 is turned off under the control of the low level of the fourth voltage terminal V4. Under the control of the pull-up node PU, the fifth transistor M5 is turned on to pull down the potential of the first pull-down node PD1 to a low level of the third voltage terminal V3. Under the control of the pull-up node PU, the seventh transistor M7 is turned on, and the fourth transistor M4 is controlled to be turned off. In this case, the fourteenth transistor M14 and the sixteenth transistor M16 are both in a turned-off state.

In addition, the third signal terminal IN3 inputs a low level, so that the eighteenth transistor M18 and the nineteenth transistor M19 are both turned off. The second signal terminal IN2 inputs a low level, so that the first transistor M1 is turned off.

In the second phase P2:

Under the control of the pull-up node PU, the output circuit 30 outputs the clock signal of the clock signal terminal CLK (in this case, the high-potential signal) to the signal output terminal OP. The signal output terminal OP outputs a gate scan signal.

In addition, the first pull-down control circuit 40 pulls down the potential of the first pull-down node PD1 to the low potential of the third voltage terminal V3 under the control of the low level of the fourth voltage terminal V4 and the high potential of the pull-up node PU. The second pull-down control circuit 50 pulls down the potential of the first pull-down node PD1 to the low potential of the third voltage terminal V3 under the control of the high level of the fifth voltage terminal V5. The third pull-down control circuit 60 pulls down the potential of the second pull-down node PD2 to the low potential of the third voltage terminal V3 under the control of the high level of the fifth voltage terminal V5 and the high potential of the pull-up node PU.

In this case, the first input circuit 10, the second input circuit 20, the fourth pull-down control circuit 70, the first pull-down circuit 80, the second pull-down circuit 90, the first noise reduction circuit 100, the second noise reduction circuit 110 and the reset circuit 120 are not turned on.

In a case where the structure of each circuit in the above shift register unit is as shown in FIG. 3A or FIG. 3B and the transistors in each of the circuits are N-type transistors, as shown in FIG. 4, in the second phase P2, the first signal terminal IN1 inputs a low level, the second signal terminal IN2 inputs a low level, the third signal terminal IN3 inputs a low level, the fourth signal terminal IN3 inputs a low level, the fourth voltage terminal V4 inputs a low voltage and the fifth voltage terminal V5 inputs a high voltage; the pull-up node PU is at a high level, the first pull-down node PD1 and the second pull-down node PD2 are at a low level, and the signal output terminal OP outputs a high level.

Since the first signal terminal IN1 outputs a low level, the second transistor M2 is in a turned-off state. The capacitor C charges the pull-up node PU such that the third transistor M3 remains a turned-on state. In this case, the high level of the clock signal terminal CLK is output to the signal output terminal OP through the third transistor M3. In addition, under the action of the bootstrapping effect of the capacitor C, the potential of the pull-up node PU is further increased to maintain the third transistor M3 in a fully turned-on state. Thereby, the high level of the clock signal terminal CLK may be output as a gate scan signal to the gate line connected to the signal output terminal OP.

As shown in FIG. 3A, under the control of the high potential of the pull-up node PU, the tenth transistor M10 is turned on. The ninth transistor M9 is turned on under the control of the high level of the fifth voltage terminal V5. However, since the width to length ratio of the channel of the tenth transistor M10 is greater than the width to length ratio of the channel of the ninth transistor M9, the potential of the second pull-down node PD2 is still pulled down to the low level of the third voltage terminal V3 through the tenth transistor M10. In this case, the fifteenth transistor M15 and the seventeenth transistor M17 are both in a turned-off state.

Under the control of the high level of the fifth voltage terminal V5, the eighth transistor M8 is turned on to pull down the potential of the first pull-down node PD1 to the low level of the third voltage terminal V3. Under the control of the low level of the fourth voltage terminal V4, the fourth transistor M4 is turned off. Under the control of the pull-up node PU, the fifth transistor M5 is turned on, and the potential of the first pull-down node PD1 is pulled down to the low level of the third voltage terminal V3. In this case, the fourteenth transistor M14 and the sixteenth transistor M16 are both in a turned-off state.

As shown in FIG. 3B, under the control of the high potential of the pull-up node PU, the tenth transistor M10 and the twelfth transistor M12 are turned on. The eleventh transistor M11 is turned on under the control of the high level of the fifth voltage terminal V5. However, since the width to length ratio of the channel of the twelfth transistor M12 is greater than the width to length ratio of the channel of the eleventh transistor M11, the gate electrode of the ninth transistor M9 is at a low level, and the ninth transistor M9 is controlled to be turned off, such that the potential of the second pull-down node PD2 is still pulled down to the low level of the third voltage terminal V3 through the tenth transistor M10. In this case, the fifteenth transistor M15 and the seventeenth transistor M17 are both in a turned-off state.

Under the control of the high level of the fifth voltage terminal V5, the eighth transistor M8 is turned on to pull down the potential of the first pull-down node PD1 to the low level of the third voltage terminal V3. The sixth transistor M6 is turned off under a control of the low level of the fourth voltage terminal V4. Under the control of the pull-up node PU, the fifth transistor M5 is turned on to pull down the potential of the first pull-down node PD1 to a low level of the third voltage terminal V3. Under the control of the pull-up node PU, the seventh transistor M7 is turned on, and the fourth transistor M4 is controlled to be turned off. In this case, the fourteenth transistor M14 and the sixteenth transistor M16 are both in a turned-off state.

In addition, the third signal terminal IN3 inputs a low level, so that the eighteenth transistor M18 and the nineteenth transistor M19 are both turned off. The second signal terminal IN2 inputs a low level, so that the first transistor M1 is turned off.

In the third phase P3:
under the control of the second signal terminal IN2, the second input circuit 20 outputs the voltage of the second voltage terminal V2 to the pull-up node PU to control the output circuit 30 to be turned off. The third pull-down control circuit 60 outputs the turned-on voltage input from the fifth voltage terminal V5 to the second pull-down node PD2 under the control of the pull-up node PU and the turn-on voltage (high level signal) input from the fifth voltage terminal V5. Under the control of the second pull-down node PD2, the second pull-down circuit 90 outputs the voltage of the third voltage terminal V3 to the signal output terminal OP, and the second noise reduction circuit 110 outputs the voltage of the third voltage terminal V3 to the pull-up node PU. Under the control of the fifth voltage terminal V5, the second pull-down control circuit 50 outputs the voltage of the third voltage terminal V3 to the first pull-down node PD1.

In this case, the first input circuit 10, the first pull-down control circuit 40, the fourth pull-down control circuit 70, the first noise reduction circuit 100, the first pull-down circuit 80 and the reset circuit 120 are not turned on.

In a case where the structure of each circuit in the above shift register unit is as shown in FIG. 3A or FIG. 3B and the transistors in each of the circuits are N-type transistors, as shown in FIG. 4, in the third phase P3, the clock signal terminal CLK inputs a low level, the first signal terminal IN1 inputs a low level, the second signal terminal IN2 inputs a high level, the third signal terminal IN3 inputs a low level, the fourth signal terminal IN4 inputs a low level, the fourth voltage terminal V4 inputs a low level, and the fifth voltage terminal V5 inputs a high level; and the pull-up node PU is at a low level, the first pull-down node PD1 is at a low level, the second pull-down node PD2 is at a high level, the signal output terminal OP outputs a low level.

Based on this, the third pull-down control circuit 60 outputs the high level of the fifth voltage terminal V5 to the second pull-down node PD2. Under the control of the second pull-down node PD2, the second pull-down circuit 90 outputs the low level of the third voltage terminal V3 to the signal output terminal OP, and the second noise reduction circuit 110 outputs the low level of the third voltage terminal V3 to the pull-up node PU. For example, in the third phase P3, the states of the transistors in each of the above circuits are as follows: since the second signal terminal IN2 outputs a high level, the first transistor M1 is turned on, thereby the potential of the pull-up node PU is pulled down to the low level of the second voltage terminal V2, so that the third transistor M3 is in a turned-off state.

As shown in FIG. 3A, under the control of the low potential of the pull-up node PU, the tenth transistor M10 is turned off. The ninth transistor M9 is turned on under the control of the high level of the fifth voltage terminal V5 to output the high level of the fifth voltage terminal V5 to the second pull-down node PD2. Under the control of the high potential of the second pull-down node PD2, the fifteenth transistor M15 and the seventeenth transistor M17 are both turned on, the potential of the pull-up node PU is pulled down to the low level of the third voltage terminal V3 through the seventeenth transistor M17, and the potential of the signal output terminal OP is pulled down to the low level of the third voltage terminal V3 through the fifteenth transistor M15.

The fifth transistor M5 is turned off under the control of the low potential of the pull-up node PU. Under the control of the low level of the fourth voltage terminal V4, the thirteenth transistor M13 and the fourth transistor M4 are both turned off. Under the control of the high level of the fifth voltage terminal V5, the eighth transistor M8 is turned on, and the potential of the first pull-down node PD1 is pulled down to the low level of the third voltage terminal V3. Under the control of the first pull-down node PD1, the fourteenth transistor M14 and the sixteenth transistor M16 are both turned off.

As shown in FIG. 3B, under the control of the low potential of the pull-up node PU, the tenth transistor M10 and the twelfth transistor M12 are both turned off. The eleventh transistor M11 is turned on under the control of the high level of the fifth voltage terminal V5, and the eleventh transistor M11 outputs the high level of the fifth voltage terminal V5 to the gate electrode of the ninth transistor M9 to control the ninth transistor M9 to be turned on. The ninth transistor M9 outputs the high level of the fifth voltage terminal V5 to the second pull-down node PD2, Under the control of the high potential of the second pull-down node PD2, the fifteenth transistor M15 and the seventeenth transistor M17 are both turned on. The potential of the pull-up node PU is pulled down to the low level of the third voltage terminal V3 through the seventeenth transistor M17, and the potential of the signal output terminal OP is pulled down to the low level of the third voltage terminal V3 through the fifteenth transistor M15.

Under the control of the low potential of the pull-up node PU, the fifth transistor M5 and the seventh transistor M7 are both turned off. Under the control of the low level of the fourth voltage terminal V4, the sixth transistor M6, the fourth transistor M4 and the thirteenth transistor M13 are both turned off. Under the control of the high level of the fifth voltage terminal V5, the eighth transistor M8 is turned on to pull down the potential of the first pull-down node PD1 to the low level of the third voltage terminal V3. Under the control of the first pull-down node PD1, the fourteenth transistor M14 and the sixteenth transistor M16 are both turned off.

In addition, the first signal terminal IN1 inputs a low level, so that the second transistor M2 is turned off. The third signal terminal IN3 inputs a low level, so that the eighteenth transistor M18 and the nineteenth transistor M19 are both turned off.

In the fourth phase P4:
under the control of the third signal terminal IN3, the reset circuit 120 outputs the voltage of the third voltage terminal V3 to the pull-up node PU and the signal output terminal OP to reset the pull-up node PU, turn off the output circuit 30 and perform noise reduction on the signal output terminal OP.

In this case, at this phase, the first input circuit 10, the second input circuit 20, the first pull-down control circuit 40, the second pull-down control circuit 50, the third pull-down control circuit 60, the fourth pull-down control circuit 70, the first pull-down circuit 80, the second pull-down circuit 90, the first noise reduction circuit 100 and the second noise reduction circuit 110 are not turned on.

In a case where the structure of each circuit in the above shift register unit is as shown in FIG. 3A or FIG. 3B and the transistors in each of the circuits are N-type transistors, as shown in FIG. 4, in the fourth phase P4, the first signal terminal IN1 inputs a low level, the second signal terminal IN2 inputs a low level, and the third signal terminal IN3 inputs a high level, the fourth voltage terminal V4 changes from a low level to a high level, and the fifth voltage terminal V5 changes from a high level to a low level. The pull-up node PU is at a low level, the first pull-down node PD1 and the second pull-down node PD2 are at a low level, and the signal output terminal OP outputs a low level.

Based on this, the high level of the clock signal terminal CLK cannot be output, and under the control of the third signal terminal IN3, the reset circuit 120 pulls down the voltages of the pull-up node PU and the signal output terminal OP to a low level of the third voltage terminal V3. For example, in the fourth phase P4, the states of the transistors in each of the above circuits are as follows: the third signal terminal IN3 inputs a high level, the eighteenth transistor M18 and the nineteenth transistor M19 are both turned on, the eighteenth transistor M18 inputs a low level of the third voltage terminal V3 to the signal output terminal OP to perform noise reduction on the signal output terminal OP. The nineteenth transistor M19 inputs the low level of the third voltage terminal V3 to the pull-up node PU to perform noise reduction on the pull-up node PU.

In this phase, except the eighteenth transistor M18 and the nineteenth transistor M19 being turned on, remaining transistors are in a turned-off state.

It should be noted that, in a case where the shift register unit does not include the reset circuit 120, the steps of the above-mentioned driving method regarding the reset circuit 120 may be omitted, and the remaining steps are not changed.

The driving method of the shift register unit provided by the embodiment of the present disclosure has the same advantageous effects as the above-described shift register unit, which will not be repeated herein.

At least one embodiment of the present disclosure further provides a driving method of the gate driving circuit above-mentioned, and the driving method includes the followings.

In an odd-numbered image frame, the fourth voltage terminal V4 of the shift register unit of each stage of the gate driving circuit inputs a turn-on signal (for example, a high level signal), and the fifth voltage terminal V5 inputs a turn-off signal (for example, a low level signal).

For example, the driving method of the shift register unit of each stage is as shown in the above embodiment in which V4=1, V5=0.

In an even-numbered image frame, the fifth voltage terminal V5 of the shift register unit of each stage of the gate driving circuit inputs a turn-on signal, and the fourth voltage terminal V4 inputs a turn-off signal.

For example, the driving method of the shift register unit of each stage is as shown in the above embodiment in which V4=0, V5=1.

Certainly, in the embodiment of the present disclosure, the driving method of the shift register unit of each stage in the (3N−2)th frame is as shown in the above embodiment in which V4=1, V5=0; in the (3N−1)th frame, the driving method of the shift register unit of each stage is as shown in the above embodiment in which V4=0, V5=1, in the 3Nth frame, the driving method of the shift register unit of each stage is as shown in the above embodiment in which V4=1, V5=0, and the like. N is an integer greater than or equal to 1.

The above description is only an exemplary embodiment of the present disclosure, and is not intended to limit the scope of the disclosure. The scope of the disclosure is defined by the appended claims.

What is claimed is:

1. A shift register unit, comprising a first input circuit, a second input circuit, an output circuit, a first pull-down control circuit, a second pull-down control circuit, a third pull-down control circuit, a fourth pull-down control circuit, a first pull-down circuit and a second pull-down circuit;

wherein the first input circuit is connected to a first signal terminal, a first voltage terminal and a pull-up node, and configured to output a voltage of the first voltage terminal to the pull-up node under a control of the first signal terminal;

the second input circuit is connected to a second signal terminal, a second voltage terminal and a pull-up node, and configured to output a voltage of the second voltage terminal to the pull-up node under a control of the second signal terminal;

the output circuit is connected to a clock signal terminal, the pull-up node and the signal output terminal, and configured to output a clock signal of the clock signal terminal to the signal output terminal under a control of the pull-up node;

the first pull-down control circuit is connected to the pull-up node, a third voltage terminal, a fourth voltage terminal and a first pull-down node, and configured to control a level of the first pull-down node;

the second pull-down control circuit is connected to a fifth voltage terminal, the third voltage terminal and the first pull-down node, and configured to output a voltage of the third voltage terminal to the first pull-down node under a control of the fifth voltage terminal;

the first pull-down circuit is connected to the first pull-down node, the third voltage terminal and the signal output terminal, and configured to output a voltage of the third voltage terminal to the signal output terminal under a control of the first pull-down node;

the third pull-down control circuit is connected to the pull-up node, the third voltage terminal, the fifth voltage terminal and a second pull-down node, and configured to control a level of the second pull-down node;

the fourth pull-down control circuit is connected to the fourth voltage terminal, the third voltage terminal and the second pull-down node, and configured to output a voltage of the third voltage terminal to the second pull-down node under a control of the fourth voltage terminal; and the second pull-down circuit is connected to the second pull-down node, the third voltage terminal and the signal output terminal, and configured to output a voltage of the third voltage terminal to the signal output terminal under a control of the second pull-down node.

2. The shift register unit according to claim 1, further comprising a first noise reduction circuit and a second noise reduction circuit;

wherein the first noise reduction circuit is connected to the first pull-down node, the third voltage terminal and the pull-up node, and configured to output a voltage of the third voltage terminal to the pull-up node under a control of the first pull-down node;

the second noise reduction circuit is connected to the second pull-down node, the third voltage terminal and the pull-up node, and configured to output a voltage of the third voltage terminal to the pull-up node under a control of the second pull-down node.

3. The shift register unit according to claim 2, wherein the shift register unit further comprises a first noise reduction circuit and a second noise reduction circuit, the first noise reduction circuit comprises a sixteenth transistor, the second noise reduction circuit comprises a seventeenth transistor;

a gate electrode of the sixteenth transistor is connected to the first pull-down node, a first electrode of the sixteenth transistor is connected to the third voltage terminal, a second electrode of the sixteenth transistor is connected to the pull-up node;

a gate electrode of the seventeenth transistor is connected to the second pull-down node, a first electrode of the seventeenth transistor is connected to the third voltage terminal, a second electrode of the seventeenth transistor is connected to the pull-up node.

4. The shift register unit according to claim 2, wherein the second input circuit comprises a first transistor;

the first input circuit comprises a second transistor;

a gate electrode of the first transistor is connected to the second signal terminal, a first electrode of the first transistor is connected to the second voltage terminal, a second electrode of the first transistor is connected to the pull-up node; and a gate electrode of the second transistor is connected to the first signal terminal, a first electrode of the second transistor is connected to the first voltage terminal, a second electrode of the second transistor is connected to the pull-up node.

5. The shift register unit according to claim 1, wherein the second input circuit comprises a first transistor;

the first input circuit comprises a second transistor;

a gate electrode of the first transistor is connected to the second signal terminal, a first electrode of the first transistor is connected to the second voltage terminal, a second electrode of the first transistor is connected to the pull-up node; and a gate electrode of the second transistor is connected to the first signal terminal, a first electrode of the second transistor is connected to the first voltage terminal, a second electrode of the second transistor is connected to the pull-up node.

6. The shift register unit of claim 1, wherein the output circuit comprises a third transistor and a capacitor;

a gate electrode of the third transistor is connected to the pull-up node, a first electrode of the third transistor is connected to the clock signal terminal, a second electrode of the third transistor is connected to the signal output terminal and a second terminal of the capacitor; and a first terminal of the capacitor is connected to the pull-up node, the second terminal of the capacitor is connected to the signal output terminal.

7. The shift register unit according to claim 1, wherein the first pull-down control circuit comprises a fourth transistor and a fifth transistor;

a gate electrode of the fourth transistor is configured to receive a voltage of the fourth voltage terminal, a first electrode of the fourth transistor is connected to the fourth voltage terminal, a second electrode of the fourth transistor is connected to the first pull-down node; and a gate electrode of the fifth transistor is connected to the pull-up node, a first electrode of the fifth transistor is connected to the third voltage terminal, a second electrode of the fifth transistor is connected to the first pull-down node.

8. The shift register unit according to claim 7, wherein the first pull-down control circuit further comprises a sixth transistor and a seventh transistor;

a gate electrode of the sixth transistor is connected to the fourth voltage terminal, a first electrode of the sixth transistor is connected to the fourth voltage terminal, a second electrode of the sixth transistor is connected to the gate electrode of the fourth transistor; and a gate electrode of the seventh transistor is connected to the pull-up node, a first electrode of the seventh transistor is connected to the third voltage terminal, a second electrode of the seventh transistor is connected to the gate electrode of the fourth transistor.

9. The shift register unit according to claim 1, wherein the second pull-down circuit comprises an eighth transistor; and a gate electrode of the eighth transistor is connected to the fifth voltage terminal, a first electrode of the eighth transistor is connected to the third voltage terminal, a second electrode of the eighth transistor is connected to the first pull-down node.

10. The shift register unit according to claim 1, wherein the third pull-down control circuit comprises a ninth transistor and a tenth transistor;

a gate electrode of the ninth transistor is configured to receive a voltage of the fifth voltage terminal, a first electrode of the ninth transistor is connected to the fifth voltage terminal, a second electrode of the ninth transistor is connected to the second pull-down node; and a gate electrode of the tenth transistor is connected to the pull-up node, a first electrode of the tenth transistor is connected to the third voltage terminal, a second electrode of the tenth transistor is connected to the second pull-down node.

11. The shift register unit according to claim 10, wherein the third pull-down control circuit further comprises an eleventh transistor and a twelfth transistor;

a gate electrode of the eleventh transistor is connected to the fifth voltage terminal, a first electrode of the eleventh transistor is connected to the fifth voltage terminal, a second electrode of the eleventh transistor is connected to the gate electrode of the ninth transistor; and a gate electrode of the twelfth transistor is connected to the pull-up node, a first electrode of the twelfth transistor is connected to the third voltage terminal, a second electrode of the twelfth transistor is connected to the gate electrode of the ninth transistor.

12. The shift register unit according to claim 1, wherein the fourth pull-down control circuit comprises a thirteenth transistor; and a gate electrode of the thirteenth transistor is connected to the fourth voltage terminal, a first electrode of the thirteenth transistor is connected to the third voltage terminal, a second electrode of the thirteenth transistor is connected to the second pull-down node.

13. The shift register unit according to claim 1, wherein the first pull-down circuit comprises a fourteenth transistor;

the second pull-down circuit comprises a fifteenth transistor;

a gate electrode of the fourteenth transistor is connected to the first pull-down node, a first electrode of the fourteenth transistor is connected to the third voltage terminal, a second electrode of the fourteenth transistor is connected to the signal output terminal; and a gate electrode of the fifteenth transistor is connected to the second pull-down node, a first electrode of the fifteenth transistor is connected to the third voltage terminal, a second electrode of the fifteenth transistor is connected to the signal output terminal.

14. A gate driving circuit, comprising at least two stages of cascaded shift register units according to claim 1;

wherein a first signal terminal of the shift register unit of a first stage is connected to a start signal terminal;

except the shift register unit of the first stage, a signal output terminal of the shift register unit of a previous stage is connected to a first signal terminal of the shift register unit of a next stage;

except the shift register unit of a last stage, a signal output terminal of a shift register unit of a next stage is connected to a second signal terminal of the shift register unit of a previous stage; and a second signal terminal of the shift register unit of the last stage is connected to the start signal terminal or a reset signal terminal separately arranged.

15. A display device, comprising the gate driving circuit of claim 14.

16. A method of driving the shift register unit according to claim 1, comprising:
  in a first phase:
    under a control of the first signal terminal, outputting by the first input circuit a voltage of the first voltage terminal to the pull-up node;
  in a second phase:
    under a control of the pull-up node, outputting by the output circuit a clock signal of the clock signal terminal to the signal output terminal, and outputting by the signal output terminal a gate scan signal;
  in a third phase:
    under a control of the second signal terminal, outputting by the second input circuit a voltage of the second voltage terminal to the pull-up node to control the output circuit to be turned off;
    under a control of the pull-up node and a turn-on voltage input by the fourth voltage terminal, outputting by the first pull-down control circuit the turn-on voltage input by the fourth voltage terminal to the first pull-down node;
    under a control of the first pull-down node, outputting by the first pull-down circuit a voltage of the third voltage terminal to the signal output terminal; and
    under a control of a turn-on voltage input by the fourth voltage terminal, outputting by the fourth pull-down control circuit a voltage of the third voltage terminal to the second pull-down node; or,
    under a control of the second signal terminal, outputting by the second input circuit a voltage of the second voltage terminal to the pull-up node to control the output circuit to be turned off;
    under a control of the pull-up node and a turn-on voltage input by the fifth voltage terminal, outputting by the third pull-down control circuit the turn-on voltage input by the fifth voltage terminal to the second pull-down node;
    under a control of the second pull-down node, outputting by a second pull-down circuit the voltage of the third voltage terminal to the signal output terminal; and
    under a control of the turn-on voltage input by the fifth voltage terminal, outputting by the second pull-down control circuit a voltage of the third voltage terminal to the first pull-down node.

17. The method of driving the shift register unit according to claim 16, wherein the shift register unit further comprises a reset circuit, the method further comprises:
  in a fourth phase, under a control of a third signal terminal, outputting by the reset circuit a voltage of the third signal terminal to the pull-up node and the signal output terminal.

18. A method of driving the gate driving circuit according to claim 14, comprising:
  in an odd-numbered image frame, inputting by the fourth voltage terminal of the shift register unit of each stage in the gate driving circuit a turn-on signal, inputting by the fifth voltage terminal a turn-off signal; and
  in an even-numbered image frame, inputting by the fifth voltage terminal of the shift register of each stage in the gate driving circuit being a turn-on signal, inputting by the fourth voltage terminal a turn-off signal.

19. The shift register unit according to claim 1, further comprising a reset circuit;
  wherein the reset circuit is connected to a third signal terminal, the third voltage terminal, the pull-up node and the signal output terminal, and configured to output a voltage of the third voltage terminal to the pull-up node and the signal output terminal under a control of the third signal terminal.

20. The shift register unit according to claim 19, wherein the reset circuit comprises an eighteenth transistor and a nineteenth transistor;
  a gate electrode of the eighteenth transistor is connected to the third signal terminal, a first electrode of the eighteenth transistor is connected to the third voltage terminal, a second electrode of the eighteenth transistor is connected to the signal output terminal; and
  a gate electrode of the nineteenth transistor is connected to the third signal terminal, a first electrode of the nineteenth transistor is connected to the third voltage terminal, a second electrode of the nineteenth transistor is connected to the pull-up node.

* * * * *